United States Patent
Yamazaki et al.

(10) Patent No.: US 12,272,700 B2
(45) Date of Patent: Apr. 8, 2025

(54) DISPLAY APPARATUS AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Koji Kusunoki, Kanagawa (JP); Shingo Eguchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 17/948,519

(22) Filed: Sep. 20, 2022

(65) Prior Publication Data

US 2023/0016214 A1 Jan. 19, 2023

Related U.S. Application Data

(63) Continuation of application No. 17/267,210, filed as application No. PCT/IB2019/056741 on Aug. 8, 2019, now Pat. No. 11,450,694.

(30) Foreign Application Priority Data

Aug. 21, 2018 (JP) ................................ 2018-154714

(51) Int. Cl.
*H01L 27/14* (2006.01)
*H01L 27/12* (2006.01)

(52) U.S. Cl.
CPC ...... *H01L 27/1255* (2013.01); *H01L 27/1225* (2013.01)

(58) Field of Classification Search
CPC ............. H01L 27/1255; H01L 27/1225; H01L 27/1222; H01L 27/124; H10K 50/00;
(Continued)

(56) References Cited

U.S. PATENT DOCUMENTS 7,221,095 B2 5/2007 Yamazaki et al.
7,348,944 B2 3/2008 Miwa et al.
(Continued)

FOREIGN PATENT DOCUMENTS

CN 102654979 A 9/2012
CN 103021334 A 4/2013
(Continued)

OTHER PUBLICATIONS

International Search Report (Application No. PCT/IB2019/056741) Dated Nov. 26, 2019.
(Continued)

*Primary Examiner* — Tan N Tran
(74) *Attorney, Agent, or Firm* — Husch Blackwell LLP

(57) ABSTRACT

A highly reliable display apparatus is provided. In an EL display apparatus including a specific pixel having a function of adding data, a storage node is provided in the pixel, and first data can be held in the storage node. In the pixel, second data is added to the first data through capacitive coupling, whereby third data can be generated. A light-emitting device operates in accordance with the third data. In the pixel, a light-emitting device that requires a high voltage for light emission or a light-emitting device to which application of a high voltage is preferred is provided.

12 Claims, 20 Drawing Sheets

(58) Field of Classification Search
CPC ........ H10K 50/13; H10K 50/19; H10K 59/35;
H10K 59/351; H10K 59/1213; H10K
59/1216; H10K 59/131; H10K 59/86;
H10K 59/32; H10K 59/121; G09F 9/30;
G09G 3/20; G09G 3/3225
USPC .......................................... 257/43, 59, 72, 98
See application file for complete search history.

(56) References Cited

U.S. PATENT DOCUMENTS

| | | | |
|---|---|---|---|
| 7,796,107 | B2 | 9/2010 | Kim |
| 8,098,006 | B2 * | 1/2012 | Ishizaki ................ H10K 59/38 |
| | | | 313/504 |
| 8,976,090 | B2 | 3/2015 | Yamamoto et al. |
| 9,209,355 | B2 | 12/2015 | Senda et al. |
| 9,257,082 | B2 | 2/2016 | Kimura et al. |
| 9,570,532 | B2 | 2/2017 | Huangfu et al. |
| 9,614,022 | B2 | 4/2017 | Miyake et al. |
| 9,754,540 | B2 | 9/2017 | Takesue et al. |
| 9,768,201 | B2 | 9/2017 | Nakamura et al. |
| 9,854,629 | B2 | 12/2017 | Ikeda et al. |
| 9,858,028 | B2 | 1/2018 | Ikeda et al. |
| 9,876,056 | B2 | 1/2018 | Seo et al. |
| 9,940,086 | B2 | 4/2018 | Yoshizumi et al. |
| 10,027,896 | B2 | 7/2018 | Ikeda |
| 10,134,912 | B2 | 11/2018 | Kimura et al. |
| 10,140,940 | B2 | 11/2018 | Aoki |
| 10,461,272 | B2 * | 10/2019 | Kim ..................... H10K 59/122 |
| 10,510,801 | B2 | 12/2019 | Sato et al. |
| 10,700,215 | B2 | 6/2020 | Kimura et al. |
| 10,770,482 | B2 | 9/2020 | Kawashima et al. |
| 11,069,817 | B2 | 7/2021 | Kimura et al. |
| 11,430,899 | B2 | 8/2022 | Kimura et al. |
| 11,652,174 | B2 | 5/2023 | Kimura et al. |
| 2003/0183830 | A1 | 10/2003 | Yamazaki et al. |
| 2009/0146929 | A1 * | 6/2009 | Kim ..................... H10K 59/35 |
| | | | 313/504 |
| 2011/0037071 | A1 | 2/2011 | Ozawa |
| 2012/0176025 | A1 | 7/2012 | Lee et al. |
| 2012/0223978 | A1 | 9/2012 | Yamamoto et al. |
| 2014/0167011 | A1 | 6/2014 | Huangfu et al. |
| 2015/0009194 | A1 | 1/2015 | Kim et al. |
| 2015/0023031 | A1 | 1/2015 | Endo |
| 2016/0037608 | A1 | 2/2016 | Ikeda et al. |
| 2016/0103649 | A1 | 4/2016 | Yoshitani et al. |
| 2016/0132281 | A1 | 5/2016 | Yamazaki et al. |
| 2017/0025080 | A1 | 1/2017 | Aoki |
| 2017/0092230 | A1 | 3/2017 | Kuwabara |
| 2017/0154947 | A1 | 6/2017 | Nakamura |
| 2017/0186365 | A1 | 6/2017 | Yoneda |
| 2017/0317151 | A1 | 11/2017 | Miyake et al. |
| 2017/0365224 | A1 | 12/2017 | Okamoto |
| 2018/0039471 | A1 | 2/2018 | Yanagisawa et al. |
| 2018/0151539 | A1 | 5/2018 | Nakamura et al. |
| 2020/0194527 | A1 | 6/2020 | Kawashima et al. |
| 2020/0357863 | A1 | 11/2020 | Nakamura et al. |
| 2020/0388658 | A1 | 12/2020 | Tsaur |
| 2021/0158755 | A1 | 5/2021 | Li et al. |
| 2021/0327966 | A1 | 10/2021 | Wang et al. |
| 2023/0299209 | A1 | 9/2023 | Kimura et al. |

FOREIGN PATENT DOCUMENTS

| | | |
|---|---|---|
| CN | 105590611 A | 5/2016 |
| CN | 107111997 A | 8/2017 |
| EP | 1887551 A | 2/2008 |
| EP | 2 743 909 A1 | 6/2014 |
| JP | 2003-216109 A | 7/2003 |
| JP | 2003-288983 A | 10/2003 |
| JP | 2005-266309 A | 9/2005 |
| JP | 2007-096055 A | 4/2007 |
| JP | 2007-123861 A | 5/2007 |
| JP | 2008-040443 A | 2/2008 |
| JP | 2008-249743 A | 10/2008 |
| JP | 2009-109600 A | 5/2009 |
| JP | 2010-044916 A | 2/2010 |
| JP | 2011-040277 A | 2/2011 |
| JP | 2011-119674 A | 6/2011 |
| JP | 2011-150009 A | 8/2011 |
| JP | 2011-150010 A | 8/2011 |
| JP | 2012-145655 A | 8/2012 |
| JP | 2012-185328 A | 9/2012 |
| JP | 2014-120478 A | 6/2014 |
| JP | 2014-197522 A | 10/2014 |
| JP | 2015-038609 A | 2/2015 |
| JP | 2016-095502 A | 5/2016 |
| JP | 2017-027012 A | 2/2017 |
| JP | 2018-022145 A | 2/2018 |
| JP | 2018-028586 A | 2/2018 |
| KR | 2009-0060750 A | 6/2009 |
| KR | 2010-0054252 A | 5/2010 |
| KR | 2012-0080856 A | 7/2012 |
| KR | 2014-0077120 A | 6/2014 |
| KR | 2015-0006144 A | 1/2015 |
| KR | 2015-0010640 A | 1/2015 |
| KR | 2017-0082548 A | 7/2017 |
| TW | 201629926 | 8/2016 |
| WO | WO-2016/051992 | 4/2016 |
| WO | WO 2016/075589 A1 | 5/2016 |

OTHER PUBLICATIONS

Written Opinion (Application No. PCT/IB2019/056741) Dated Nov. 26, 2019.
International Search Report (Application No. PCT/IB2018/059087) Dated Feb. 26, 2019.
Written Opinion (Application No. PCT/IB2018/059087) Dated Feb. 26, 2019.
Chinese Office Action (Application No. 201980054162.4) Dated Feb. 13, 2024.

* cited by examiner

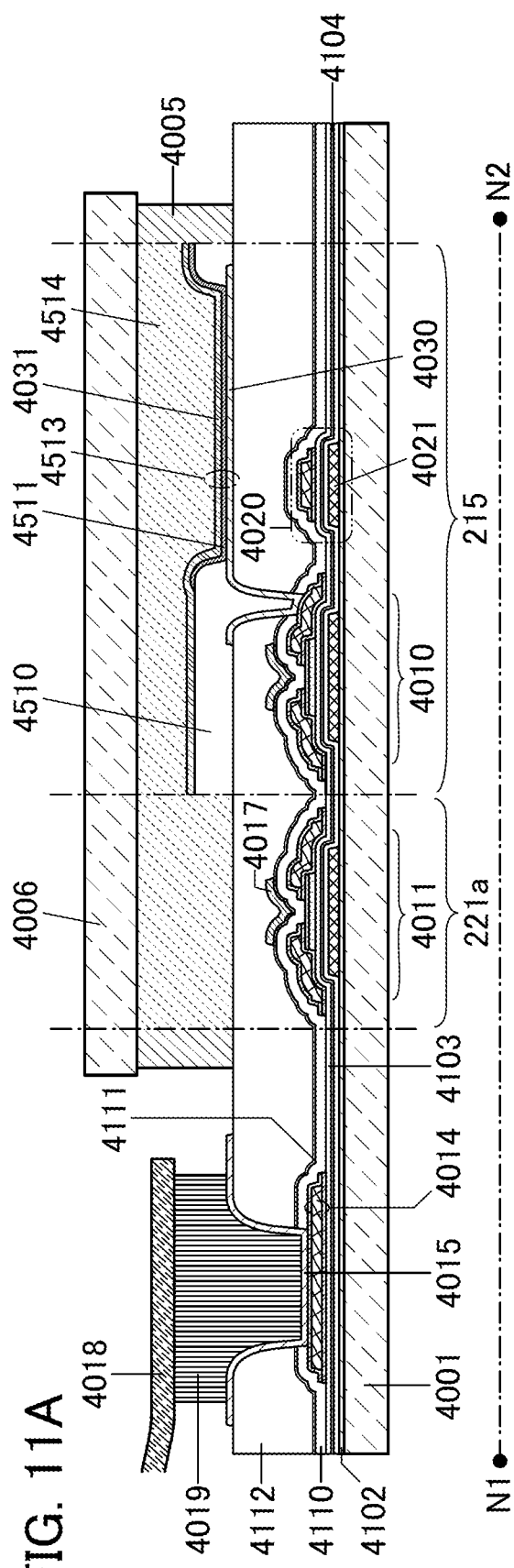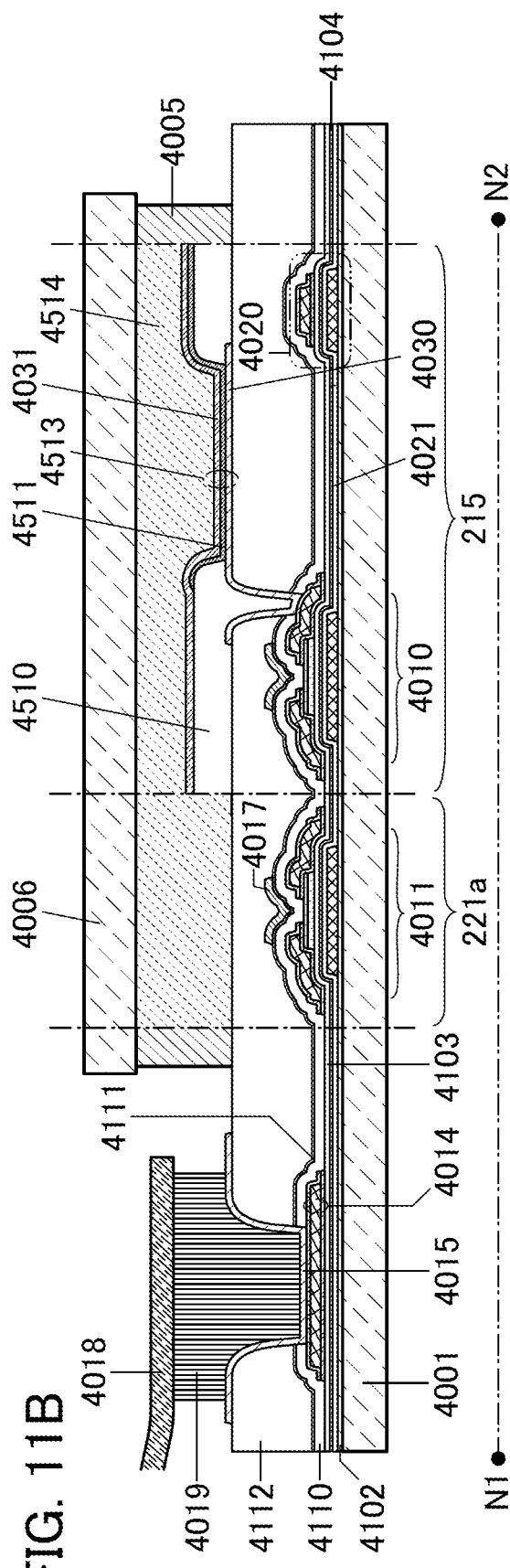

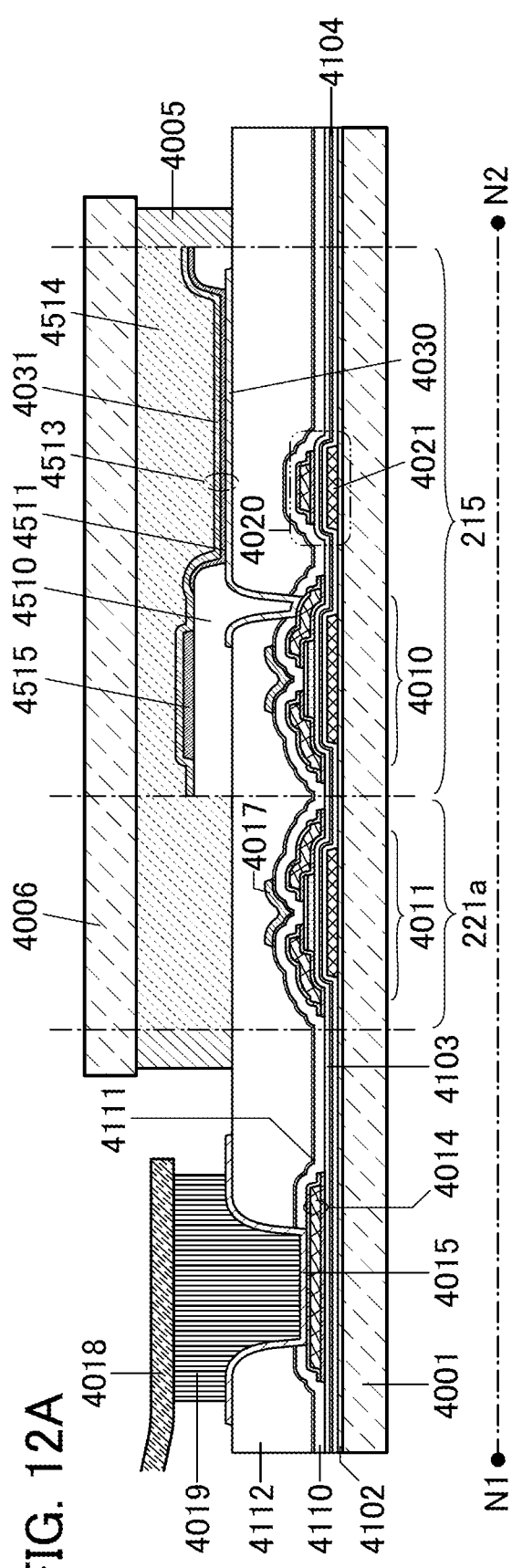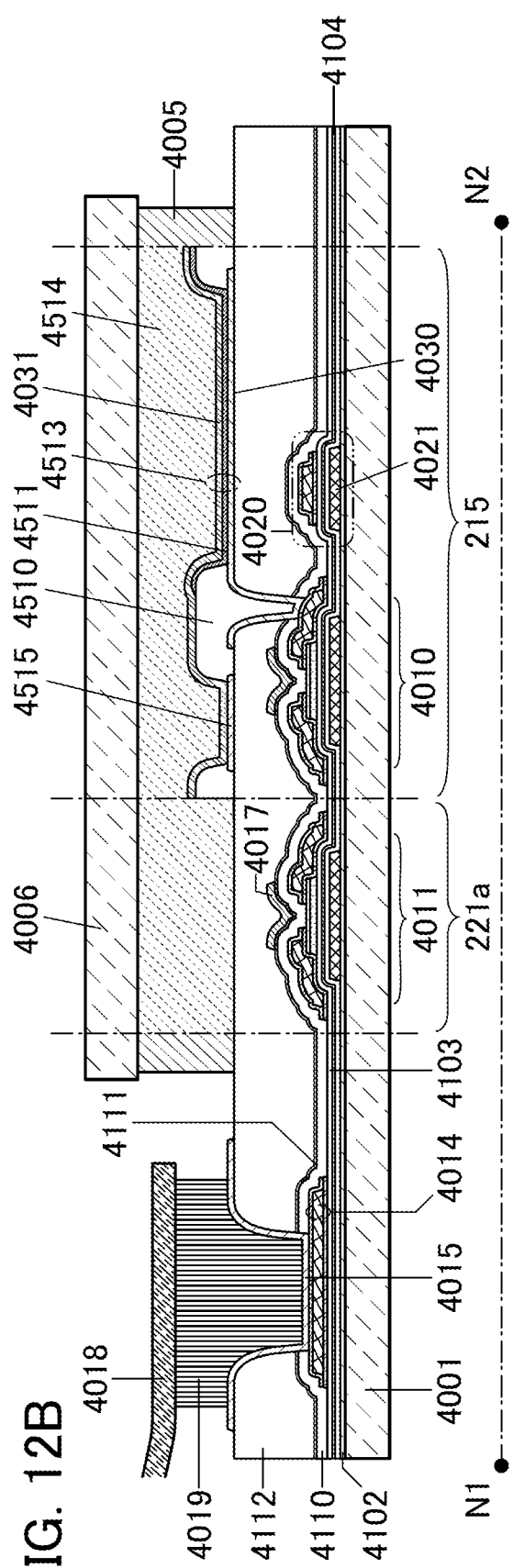

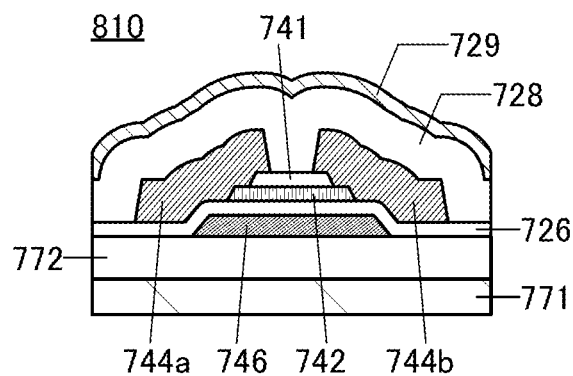
FIG. 16A1
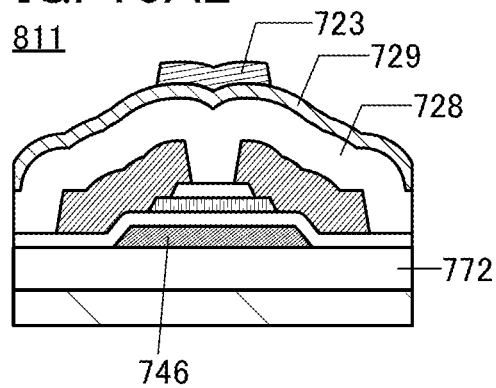
FIG. 16A2
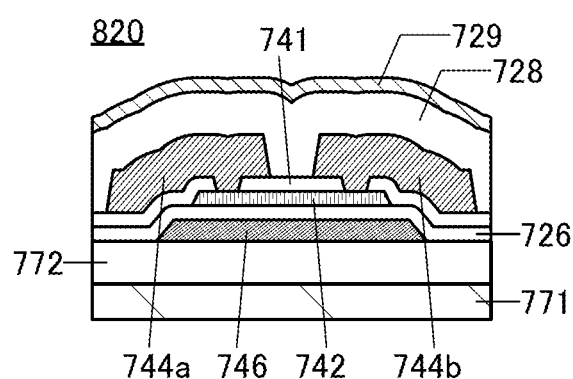
FIG. 16B1
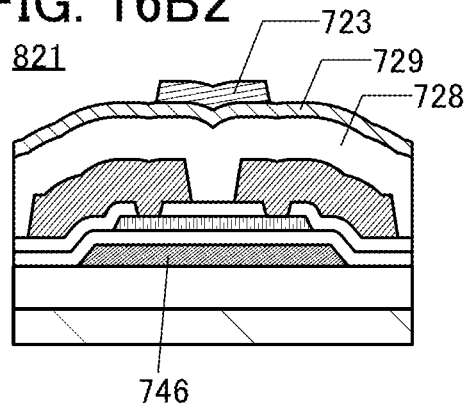
FIG. 16B2
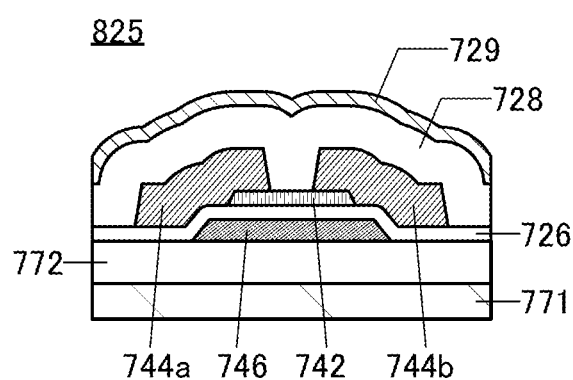
FIG. 16C1
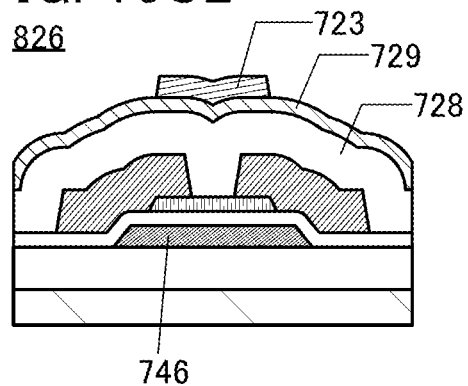
FIG. 16C2

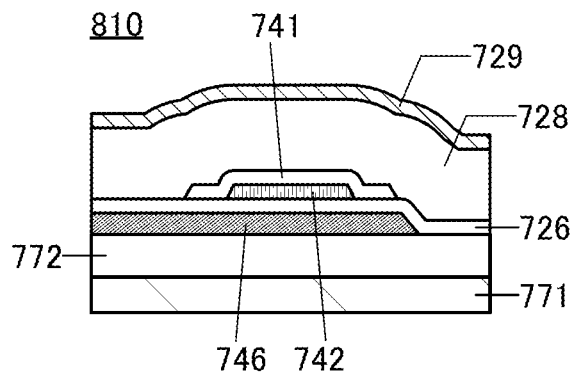
FIG. 17A1
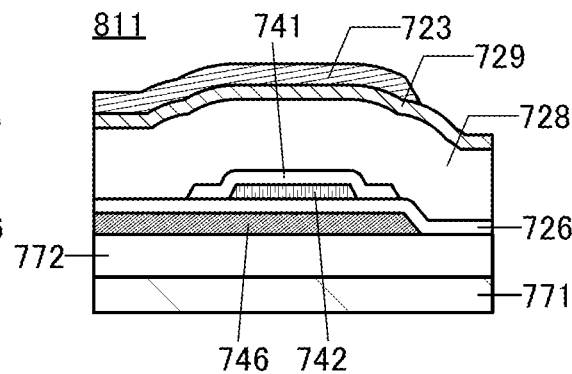
FIG. 17A2
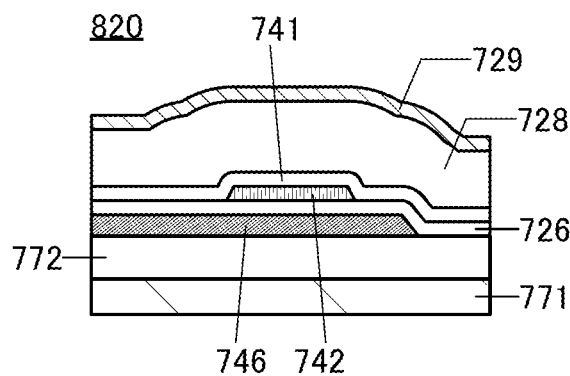
FIG. 17B1
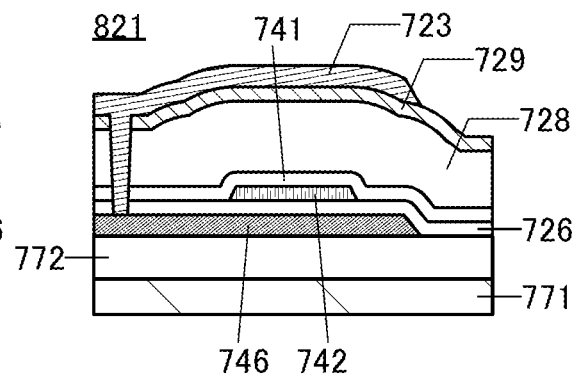
FIG. 17B2
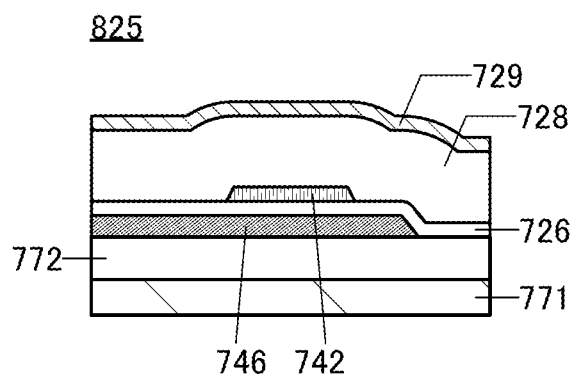
FIG. 17C1
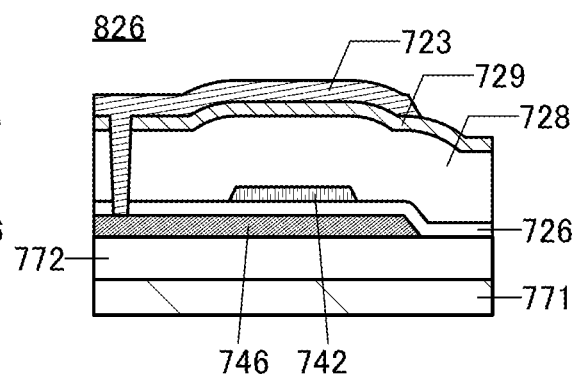
FIG. 17C2

FIG. 18A1
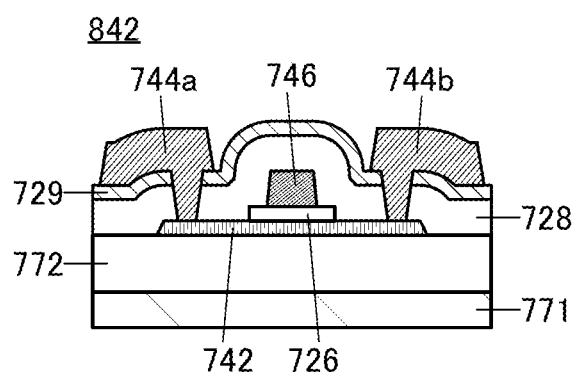
FIG. 18A2
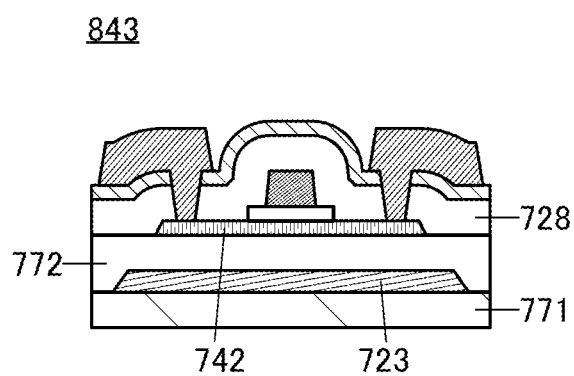
FIG. 18B1
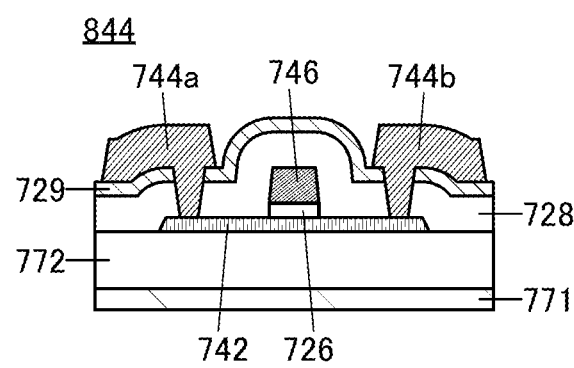
FIG. 18B2
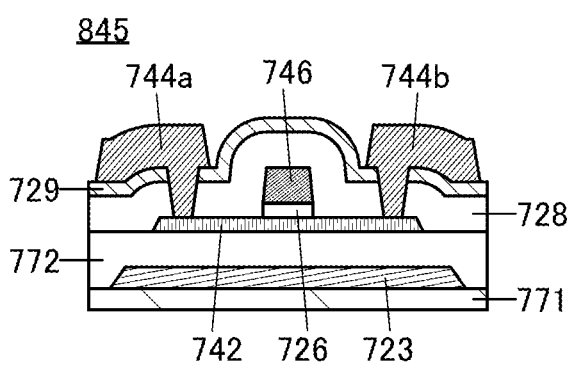
FIG. 18C1
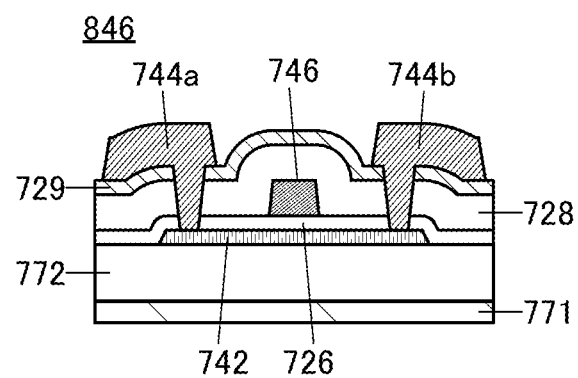
FIG. 18C2
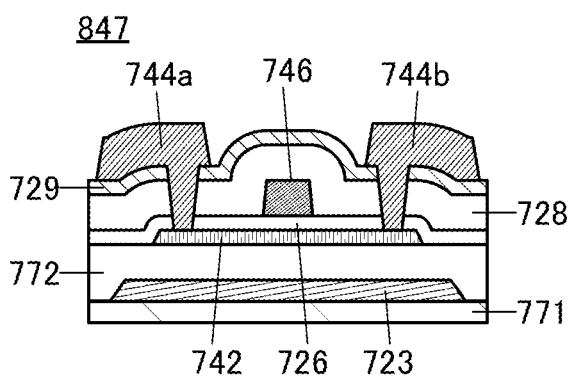

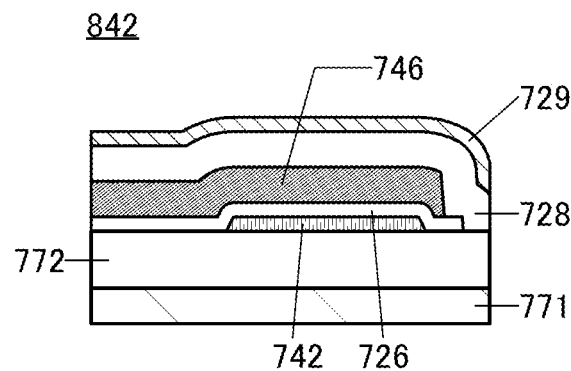
FIG. 19A1
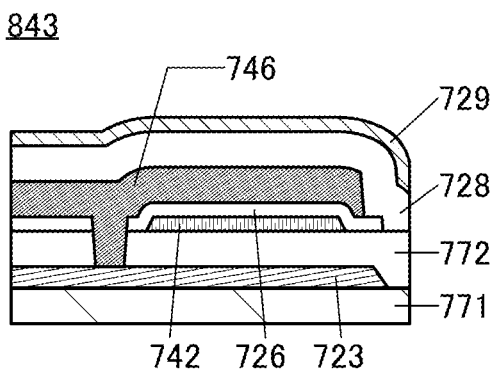
FIG. 19A2
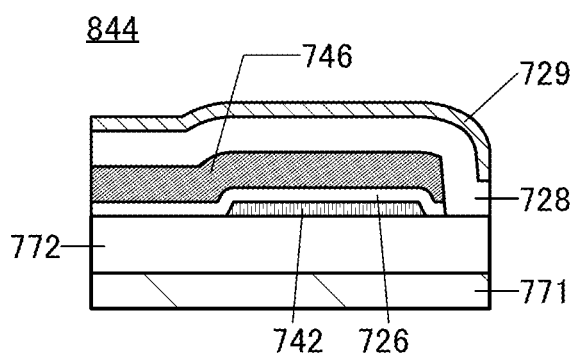
FIG. 19B1
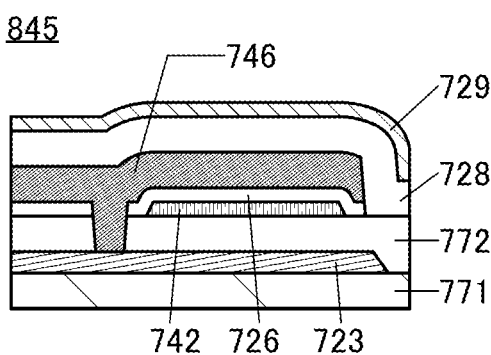
FIG. 19B2
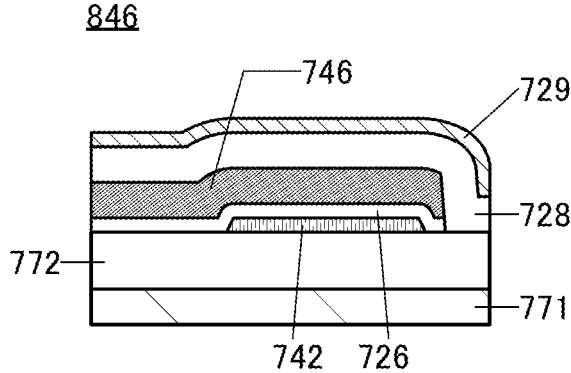
FIG. 19C1
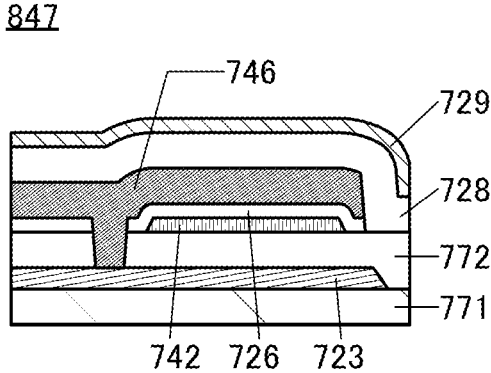
FIG. 19C2

DISPLAY APPARATUS AND ELECTRONIC DEVICE

This application is a continuation of U.S. application Ser. No. 17/267,210 filed Feb. 9, 2021, entitled, "Display Apparatus and Electronic Device", which is a 371 of international application PCT/IB2019/056741 filed on Aug. 8, 2019, both of which are hereby incorporated by reference as if fully set forth herein.

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter.

Specifically, examples of the technical field of one embodiment of the present invention disclosed in this specification include a semiconductor device, a display apparatus, a liquid crystal display apparatus, a light-emitting apparatus, a lighting device, a power storage device, a memory device, an imaging device, a driving method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display apparatus, an imaging device, or an electronic device includes a semiconductor device.

BACKGROUND ART

A technique for forming transistors using a metal oxide formed over a substrate has been attracting attention. For example, a technique in which a transistor formed using zinc oxide or an In—Ga—Zn-based oxide is used as a switching element or the like of a pixel of a display apparatus is disclosed in Patent Document 1 and Patent Document 2.

Patent Document 3 discloses a memory device having a structure in which a transistor with an extremely low off-state current is used in a memory cell.

REFERENCE

Patent Document

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

Liquid crystal display apparatuses in which a larger-size, higher-definition display portion can be easily achieved, are often used as display apparatuses used for televisions, portable information terminals, and the like. In addition, liquid crystal display apparatuses constitute an important factor in supporting technologies such as 3D images, VR (virtual reality), AR (augmented reality), and the like.

On the other hand, being non-luminous display apparatuses, liquid crystal display apparatuses have challenges such as need of a light source, relatively slow response speed, and difficulty in providing flexibility. Substituting liquid crystal display apparatuses with EL display apparatuses is one of the means to overcome these challenges. Being self-luminous display apparatuses, EL display apparatuses require no light source, have a high contrast, and respond at high speed. In addition, EL display apparatuses can be viewed at wide angles, do not require cell gap control, which is unique to liquid crystal elements, and thus can be made flexible.

However, fabrication of EL display apparatuses requires an advanced technique, and has challenges in variations in transistor characteristics and reliability of light-emitting devices (also referred to as light-emitting elements).

In view of the above, one object of one embodiment of the present invention is to provide a highly reliable EL display apparatus. Another object is to provide an EL display apparatus with low power consumption. Another object is to provide a novel EL display apparatus or the like. Another object is to provide a method for driving any of the above EL display apparatuses. Another object is to provide a novel semiconductor device or the like.

Note that the description of these objects does not preclude the existence of other objects. One embodiment of the present invention does not have to achieve all these objects. Note that other objects are apparent from and can be derived from the description of the specification, the drawings, the claims, and the like.

Means for Solving the Problems

One embodiment of the present invention relates to a highly reliable EL display apparatus. Another embodiment relates to an EL display apparatus capable of reducing power consumption.

One embodiment of the present invention is a display apparatus including a first pixel and a second pixel, in which the first pixel includes a first light-emitting device, the second pixel includes a second light-emitting device, the first light-emitting device has a single structure including a light-emitting unit between a pair of electrodes, the second light-emitting device has a tandem structure including two or more light-emitting units being connected in series between a pair of electrodes, the first pixel has a function of storing first data, the first light-emitting device has a function of emitting light based on the first data, the second pixel has a function of storing second data, the second pixel has a function of adding third data to the second data to generate fourth data, and the second light-emitting device has a function of emitting light based on the fourth data.

Another embodiment of the present invention is a display apparatus including a first pixel and a second pixel; in which the first pixel includes a first transistor, a second transistor, a first capacitor, and a first light-emitting device; one of a source and a drain of the first transistor is electrically connected to one electrode of the first capacitor; the one electrode of the first capacitor is electrically connected to a gate of the second transistor; one of a source and a drain of the second transistor is electrically connected to one electrode of the first light-emitting device; the second pixel includes a third transistor, a fourth transistor, a fifth transistor, a second capacitor, a third capacitor, and a second light-emitting device; one of a source and a drain of the third transistor is electrically connected to one electrode of the second capacitor; the one electrode of the second capacitor is electrically connected to one electrode of the third capacitor; the other electrode of the third capacitor is electrically connected to one of a source and a drain of the fourth transistor; the one electrode of the second capacitor is electrically connected to a gate of the fifth transistor; one of a source and a drain of the fifth transistor is electrically connected to one electrode of the second light-emitting device; the first light-emitting device has a single structure including a light-emitting unit between a pair of electrodes; and the second light-emitting device has a tandem structure including two or more light-emitting units being connected in series between a pair of electrodes.

It is preferable that the first light-emitting device emit red or green light and that the second light-emitting device emit blue or white light.

It is preferable that the other electrode of the first light-emitting device and the other electrode of the second light-emitting device be each a light-transmitting conductive film, and that the light-transmitting conductive film is in contact with a metal wiring not overlapping with the first light-emitting device and the second light-emitting device.

It is preferable that the first to fifth transistors each include a metal oxide in a channel formation region and that the metal oxide includes In, Zn, and M (M is Al, Ti, Ga, Sn, Y, Zr, La, Ce, Nd, or Hf).

Effect of the Invention

With the use of one embodiment of the present invention, a highly reliable EL display apparatus can be provided. Alternatively, an EL display apparatus with low power consumption can be provided. Alternatively, a novel EL display apparatus or the like can be provided. Alternatively, a method for driving any of the above EL display apparatuses can be provided. Alternatively, a novel semiconductor device or the like can be provided.

BRIEF DESCRIPTION OF THE DRAWINGS

FIGS. 11(A) and 11(B) are diagrams each illustrating a display apparatus.

FIGS. 12(A) and 12(B) are diagrams each illustrating a display apparatus.

FIGS. 16(A1) to 16(C2) are diagrams each illustrating a transistor.

FIGS. 17(A1) to 17(C2) are diagrams each illustrating a transistor.

FIGS. 18(A1) to 18(C2) are diagrams each illustrating a transistor.

FIGS. 19(A1) to 19(C2) are diagrams each illustrating a transistor.

MODE FOR CARRYING OUT THE INVENTION

Figure 1:
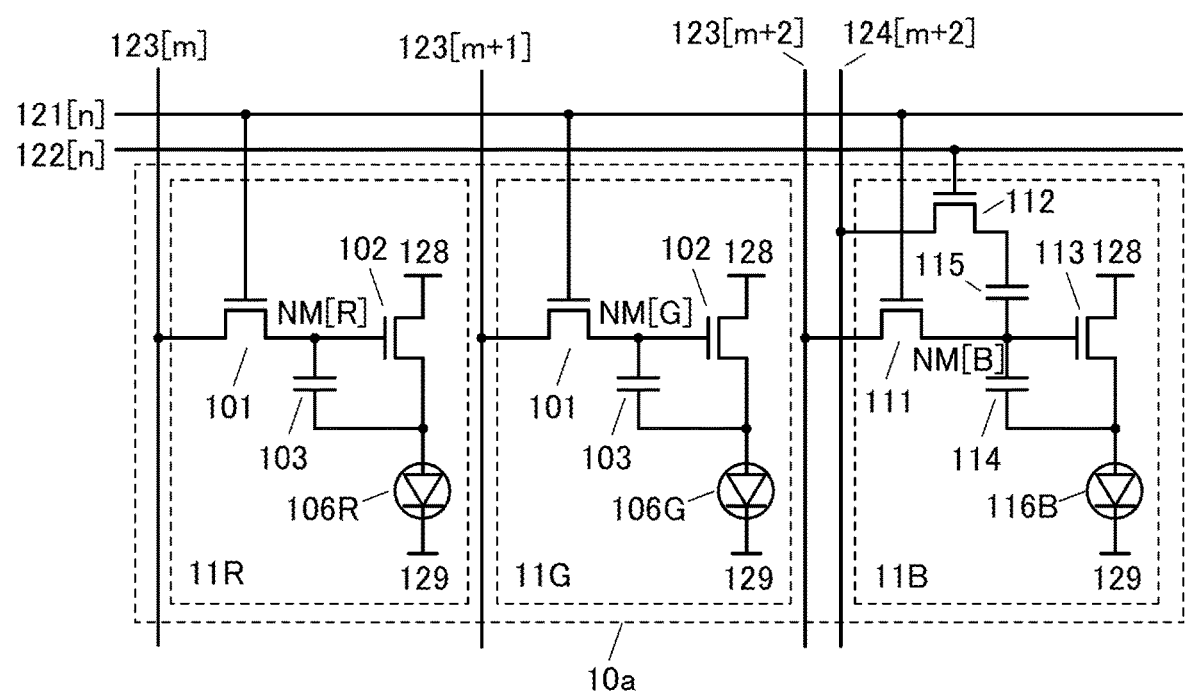
FIG. 1 is a diagram illustrating a pixel circuit.

Embodiments are described in detail with reference to the drawings. Note that the present invention is not limited to the following description, and it will be readily understood by those skilled in the art that modes and details can be modified in various ways without departing from the spirit and scope of the present invention. Thus, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, a capacitor (also referred to as a capacitive element) may be divided to be placed in a plurality of positions.

One conductor has a plurality of functions such as a wiring, an electrode, and a terminal in some cases. In this specification, a plurality of names is used for the same component in some cases. Even in the case where components are illustrated in a circuit diagram as if they were directly connected to each other, the components may actually be connected to each other through a plurality of conductors; in this specification, even such a structure is included in direct connection.

Embodiment 1

In this embodiment, a display apparatus that is one embodiment of the present invention will be described with reference to drawings.

One embodiment of the present invention is an EL display apparatus in which a pixel having a function of adding data is provided. A storage node is provided in the pixel, and first data can be held in the storage node. In the pixel, second data is added to the first data through capacitive coupling, whereby third data can be generated. A light-emitting device operates in accordance with the third data.

In addition, the EL display apparatus includes a pixel without the function of adding data. Thus, the operation of adding data is performed only in a specific pixel. In that specific pixel, a light-emitting device that requires a high voltage for light emission, or a light-emitting device to which application of a high voltage is preferred is provided.

With pixels having different functions as described above, writing speed and reliability of the light-emitting device can be improved. In addition, since a relatively high voltage can be generated in the pixel, a general data driver can be used instead of using a special data driver that outputs a high voltage. As a result, the power consumption and manufacturing cost can be reduced.

FIG. 1 is a diagram illustrating a pixel 10a that can be used for a display apparatus of one embodiment of the present invention. The pixel 10a includes three subpixels: a pixel 11R provided in the n-th row and the m-th column (n and m are each a natural number of 1 or greater), a pixel 11G provided in the n-th row and the m+1-th column, and a pixel 11B provided in the n-th row and the m+2-th column. The pixel 11R, the pixel 11G, and the pixel 11B emit light of red, green, and blue colors, respectively; light emitted by the three subpixels enables color display.

The pixel 11R includes a transistor 101, a transistor 102, a capacitor 103, and a light-emitting device 106R. The light-emitting device 106R has a structure of emitting red light.

Components included in the pixel 11G are the same as those of the pixel 11R except that a light-emitting device 106G, instead of the light-emitting device 106R, is included. The light-emitting device 106G has a structure of emitting green light.

In the pixel 11R, one of a source and a drain of the transistor 101 is electrically connected to one electrode of the capacitor 103. The one electrode of the capacitor 103 is electrically connected to a gate of the transistor 102. One of a source and a drain of the transistor 102 is electrically connected to one electrode of the light-emitting device 106R. The other electrode of the capacitor 103 is electrically connected to the one of the source and the drain of the transistor 102, for example. The components of the pixel 11G can also have the connection configuration similar to that of the components of the pixel 11R.

The pixel 11B includes a transistor 111, a transistor 112, a transistor 113, a capacitor 114, a capacitor 115, and alight-emitting device 116B. The light-emitting device 116B has a structure of emitting blue light. Although details will be described later, two pieces of data input from the transistor 111 and the transistor 112 can be added through capacitive coupling at the capacitor 115 in the pixel 11B.

One of a source and a drain of the transistor 111 is electrically connected to one electrode of the capacitor 114. The one electrode of the capacitor 114 is electrically connected to one electrode of the capacitor 115. The other electrode of the capacitor 115 is electrically connected to one of a source and a drain of the transistor 112. The one electrode of the capacitor 114 is electrically connected to a gate of the transistor 113. One of a source and a drain of the transistor 113 is electrically connected to one electrode of the light-emitting device 116B. The other electrode of the capacitor 114 is electrically connected to the one of the source and the drain of the transistor 113, for example.

Agate of the transistor 101 and a gate of the transistor 111 are electrically connected to a wiring 121[*n*]. Agate of the transistor 112 is electrically connected to a wiring 122[*n*].

In the pixel 11R, the other of the source and the drain of the transistor 101 is electrically connected to a wiring 123[*m*]. In the pixel 11G, the other of the source and the drain of the transistor 101 is electrically connected to a wiring 123[*m*+1]. In the pixel 11B, the other of the source and the drain of the transistor 111 is electrically connected to a wiring 123[*m*+2], and the other of the source and the drain of the transistor 112 is electrically connected to a wiring 124[*m*+2].

The other of the source and the drain of the transistor 102 and the other of the source and the drain of the transistor 113 are each electrically connected to a wiring 128. The other electrode of each of the light-emitting devices 106R, 106G, and 116B is electrically connected to a wiring 129.

The wirings 121[*n*] and 122[*n*] can each have a function of a signal line for controlling the transistor operation. The wirings 123[*m*] to 123[*m*+2] can each have a function of a signal line for supplying image data. The wiring 124[*m*+2] can have a function of a signal line for supplying a reference potential, image data, or the like. The wirings 128 and 129 can each have a function of a power supply line. In the connection configuration of the light-emitting devices shown in FIG. 1, the wiring 128 can serve as a power supply line for supplying a high potential and the wiring 129 can serve as a power supply line for supplying a low potential or a GND potential line, for example.

In the pixel 11R, a wiring to which the one of the source and the drain of the transistor 101, the one electrode of the capacitor 103, and the gate of the transistor 102 are connected is referred to as a node NM[R]. Similarly, in the pixel 11G, the corresponding wiring is referred to as a node NM[G]. In the pixel 11B, a wiring to which the one of the source and the drain of the transistor 111, the one electrode of the capacitor 114, the one electrode of the capacitor 115, and the gate of the transistor 113 are connected is referred to as a node NM[B].

The node NM[R], the node NM[G], and the node NM[B] are storage nodes. In the pixel 11R, for example, turning on the transistor 101 enables data supplied to the wiring 123[*m*] to be written to the node NM[R]. Turning off the transistor 101 enables the data to be held in the node NM[R]. The same applies to the node NM[G] and the node NM[B].

The use of a transistor with an extremely low off-state current as each of the transistor 101 and the transistor 111 enables potentials of the node NM[R], the node NM[G], and the node NM[B] to be held for a long time. Thus, the frame frequency at which data is written for still images and the like can be reduced, whereby the power consumption of the display apparatus can be lowered. In addition, to suppress a change in potential of the node NM[B] via the capacitor 115, it is preferable to use a transistor with a low off-state current as the transistor 112 as well.

As the transistor, a transistor using a metal oxide in a channel formation region (hereinafter, an OS transistor) can be used, for example.

Note that OS transistors may be used as other transistors that constitute pixels, in addition to the transistors 101 and 111. Alternatively, transistors including Si in the channel formation region (hereinafter, Si transistors) may be used as the transistors 101 and 111. Alternatively, both an OS transistor and a Si transistor may be used to constitute pixels. Examples of the Si transistor include a transistor including amorphous silicon and a transistor including crystalline silicon (typically, low-temperature polysilicon or single crystal silicon).

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

An OS transistor has a large energy gap, and thus the OS transistor has characteristics with an extremely low off-state current of several yA/μm (current per micrometer of a channel width). An OS transistor has the following feature different from that of a Si transistor: impact ionization, an avalanche breakdown, a short-channel effect, or the like does not occur. Thus, the use of an OS transistor enables formation of a circuit having high withstand voltage and high reliability. Moreover, variations in electrical characteristics due to crystallinity unevenness, which are caused in Si transistors, are less likely to occur in OS transistors.

A semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). The In-M-Zn-based oxide can be typically formed by a sputtering method. Alternatively, the In-M-Zn-based oxide can be formed by an ALD (Atomic Layer Deposition) method.

It is preferable that the atomic ratio of metal elements of a sputtering target used for forming the In-M-Zn-based oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements in the sputtering target in a range of ±40%.

An oxide semiconductor with low carrier density is used for the semiconductor layer. For example, the semiconductor layer may use an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$. Such an oxide semiconductor is referred to as a highly purified intrinsic or substantially highly purified intrinsic oxide semiconductor. The oxide semiconductor has a low density of defect states and can thus be regarded as having stable characteristics.

Note that, without limitation to these, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased in the semiconductor layer, and the semiconductor layer becomes n-type. Thus, the concentration of silicon or carbon (the concentration obtained by SIMS: Secondary Ion Mass Spectrometry) in the semiconductor layer is set to $2 \times 10^{18}$ atoms/cm$^3$ or lower, preferably $2 \times 10^{17}$ atoms/cm$^3$ or lower.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by SIMS) is set to $1 \times 10^{18}$ atoms/cm$^3$ or lower, preferably $2 \times 10^{16}$ atoms/cm$^3$ or lower.

When the oxide semiconductor in the semiconductor layer contains nitrogen, electrons functioning as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (the concentration obtained by SIMS) is preferably set to $5 \times 10^{18}$ atoms/cm$^3$ or lower.

When hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect where hydrogen enters an oxygen vacancy functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor obtained by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of a non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a CAC (Cloud-Aligned Composite)-OS, which is one embodiment of a non-single-crystal semiconductor layer, is described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In-Ga—Zn oxide with the CAC composition (such an In-Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region containing $GaO_{X3}$ as a main component and a region containing $In_{X2}Zn_{Y2}O_{Z2}$ or $InO_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals has c-axis alignment and is connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like is contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible; for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the XRD measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region is observed. Thus, it is found from the electron diffraction pattern that the crystal structure of the CAC-OS includes an nc (nano-crystal) structure that does not show alignment in the plane direction and the cross-sectional direction.

For example, energy dispersive X-ray spectroscopy (EDX) is used to obtain EDX mapping, and according to the EDX mapping, the CAC-OS of the In-Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is generated. Accordingly, when the regions containing $In_{X2}Zn_{Y2}O_{Z2}$ or $InO_{X1}$ as a main component are distributed like a cloud in an oxide semiconductor, high field-effect mobility ($\mu$) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the regions containing $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element using a CAC-OS has high reliability. Thus, the CAC-OS is suitably used as a material in a variety of semiconductor devices.

In the pixel 11R, necessary data is written to the node NM[R] in one writing operation, and light emission of the light-emitting device 106R is controlled in accordance with the data. The same applies to the pixel 11G. In the pixel 11B, in contrast, after first data is written to the node NM[B], second data is added to the first data through capacitive coupling, and light emission of the light-emitting device 116B is controlled in accordance with the generated third data.

In other words, a relatively low voltage is applied to the light-emitting device that emits red light or green light, and a relatively high voltage is applied to the light-emitting device that emits blue light.

Here, the advantage of applying a high voltage to the light-emitting device that emits blue light will be described.

A fluorescent material or a phosphorescent material is used in a light-emitting layer included in a light-emitting device. A light-emitting device using a fluorescent material has a relatively long lifetime, but its luminous efficiency is low since it can only convert 25%, at a maximum, of the input power into light. In contrast, a light-emitting device using a phosphorescent material can convert 100% of the input power into light in theory. However, expensive rare metals are usually used for phosphorescent materials. In addition, a phosphorescent material has challenges in productivity such as a yield and purification, which raises a cost issue. Under the current circumstances, phosphorescent materials that can be utilized for mass production are limited to those for red and green colors, and fluorescent materials are used for a blue color.

Thus, with the same device structure and the same power being provided, a light-emitting device that emits blue light is lower in luminance than a light-emitting device that emits red or green light. Since the luminance of a light-emitting device is proportional to a current, increasing a voltage to allow a larger amount of current to flow can increase the luminance. However, supplying a large amount of current to the device leads to a problem in which the device lifetime is shortened by current stress.

Thus, a blue light-emitting device preferably has a tandem structure. With a tandem structure, current stress on each element can be reduced and the device lifetime can be extended. Note that as long as the effect on the device lifetime is acceptable, a single structure may be used.

In this specification, a structure in which two or more light-emitting units are connected in series between a pair of electrodes is referred to as a tandem structure. In the tandem structure, it is suitable that a charge-generation layer is provided between a plurality of light-emitting units. A structure in which one light-emitting unit is provided between a pair of electrodes is referred to as a single structure. The light-emitting unit includes at least a light-emitting layer, and may include other functional layers (such as a hole-transport layer, a hole-injection layer, an electron-transport layer, and an electron-injection layer). The details of the light-emitting unit will be described in Embodiment 2.

Figure 2A:
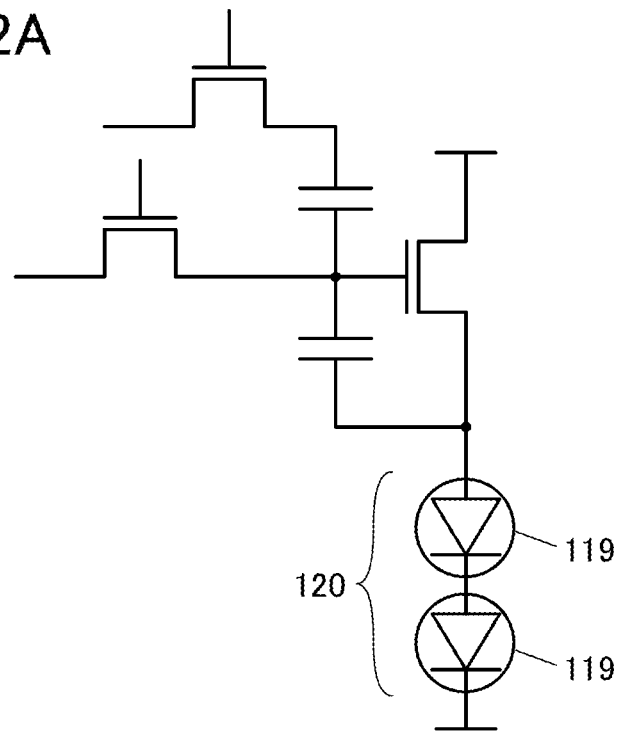
FIG. 2(A) is an equivalent circuit of a light-emitting device.

The equivalent circuit of a light-emitting device 120 with a two-layer tandem structure incorporated in a pixel circuit has a form where two diodes 119 are connected in series, as illustrated in FIG. 2(A), for example.

Figure 2B:
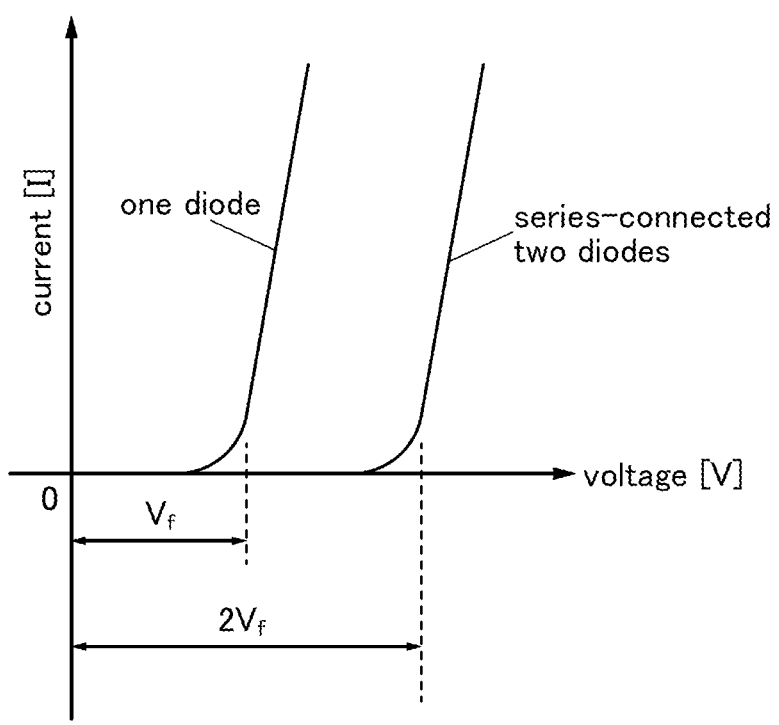
FIG. 2(B) is a diagram showing a voltage drop.

FIG. 2(B) is I-V characteristics showing the forward characteristics of light-emitting devices (diodes). When the forward voltage of a light-emitting device is "$V_f$" and two of such light-emitting devices are connected in series, the voltage at which a current starts to flow through the two light-emitting devices is "$2V_f$" or higher.

With a tandem structure where light emission can be obtained from a plurality of light-emitting units, however, higher emission intensity than that with a single structure can be obtained when the same current is made to flow therethrough. In addition, the reliability can be improved as compared with the case where emission intensity is increased by applying a large current in a single structure.

As described above, the tandem structure requires a voltage supplied to the light-emitting device to be increased. Thus, a data driver capable of high voltage output is required in some cases. However, in one embodiment of the present invention, a relatively high voltage can be generated in a pixel circuit by addition of the voltage output from a data driver; thus, operation with low power consumption is possible. Furthermore, a data driver capable of high voltage output does not need to be used, and a general data driver or the like can be used. Alternatively, a display device (also referred to as a display element) that is difficult to operate even with a data driver capable of high voltage output can be operated.

Although an example where the function of adding data is provided only in the pixel 11B in order to reduce write time is described in this embodiment, one embodiment of the present invention is not limited thereto; the data-adding function may be provided in the pixel 11R and the pixel 11G as well.

In the pixel 11B, first data (weight: W) is written to the node NM[B] first. At this time, a reference potential "$V_0$" is supplied to the other electrode of the capacitor 115, and the capacitor 115 is made to hold "$W-V_0$". Next, the node NM[B] is set to be floating and second data (data: D) is supplied to the other electrode of the capacitor 115.

At this time, when the capacitance value of the capacitor 115 is set to $C_{115}$ and the capacitance value of the node NM[B] is set to $C_{NM[B]}$, the potential of the node NM[B] becomes "$W+(C_{115}/(C_{115}+C_{NM[B]}))\times(D-V_0)$". Here, when the value of $C_{115}$ is made large and the value of $C_{NM[B]}$ becomes negligible, the potential of the node NM becomes "$W+D-V_0$".

Thus, when "W"="D", "$V_0$"=0 V, and $C_{115}$ is sufficiently larger than $C_{NM[B]}$, the potential of the node NM[B] becomes closer to "2D". In other words, the third data ("2D"), which is a potential approximately twice the potential output from the data driver to the pixel, can be supplied to the node NM[B].

Figure 3:
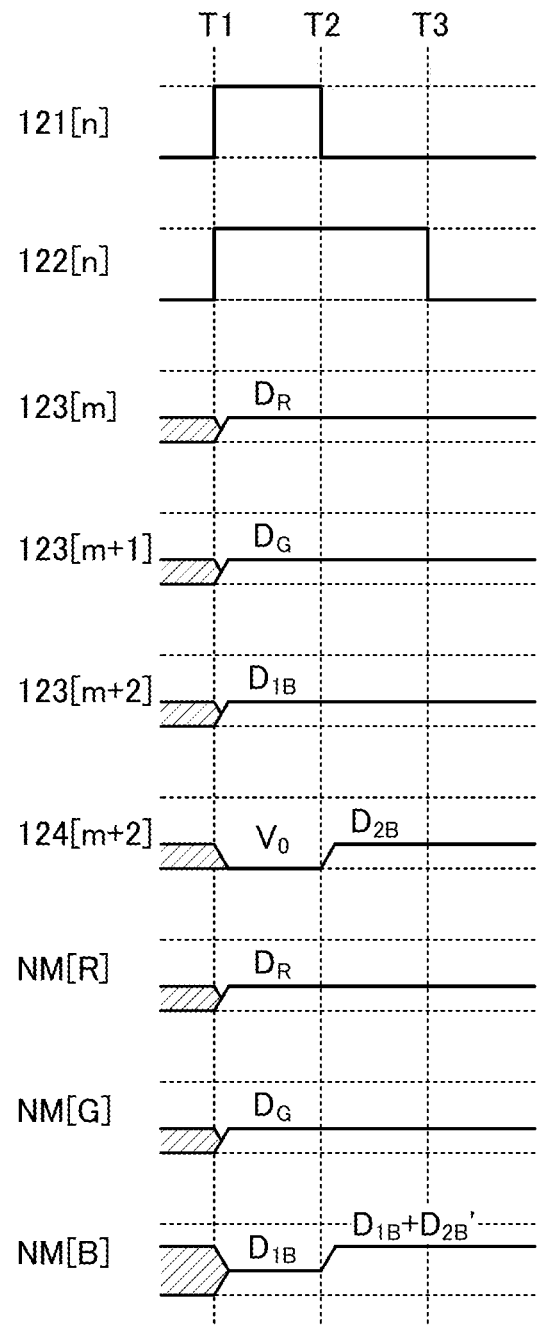
FIG. 3 is a timing chart showing the operation of a pixel circuit.

An example of the operation of the pixel 10a shown in FIG. 1 will be described with reference to a timing chart shown in FIG. 3. Note that in the following description, a high potential is represented by "H" and a low potential is represented by "L". Furthermore, data supplied to the pixel 11[R] is referred to as "$D_R$", data supplied to the pixel 11[G] is referred to as "$D_G$", first data (corresponding to weight) supplied to the pixel 11[B] is referred to as "$D_{1B}$", and second data (corresponding to data) is referred to as "$D_{2B}$". As "$V_0$", 0 V, a GND potential, or a certain reference potential can be used, for example.

Note that in potential distribution, potential coupling, or potential loss, detailed changes due to a circuit configuration, operation timing, or the like are not considered. A change in potential due to capacitive coupling using a capacitor depends on the capacitance ratio of the capacitor to a component connected thereto; however, for simplicity of the description, the capacitance value of the component is assumed to be sufficiently small. In FIG. 3, an example of data write in accordance with a line sequential method is shown; however, a dot sequential method may also be used.

At time T1, when the potential of the wiring 121[$n$] is set to "H" and the potential of the wiring 122[$n$] is set to "H", the transistor 101 is turned on in the pixels 11R and 11G. Furthermore, the transistor 111 and the transistor 112 are turned on in the pixel 11B.

At time T1, "$D_R$" supplied to the wiring 123[$m$] is written to the node NM[R] in the pixel 11[R].

In addition, "$D_G$" supplied to the wiring 123[$m$+1] is written to the node NM[G] in the pixel 11[G].

In addition, "$D_{1B}$" supplied to the wiring 123[$m$+2] is written to the node NM[B] in the pixel 11[B].

The potential of the other electrode of the capacitor 115 is set to "$V_0$", a potential supplied to the wiring 124[$m$+2]. This operation is a reset operation for an addition operation (capacitive coupling operation) to be performed later. At this time, "$D_{1B}-V_0$" is held in the capacitor 115.

At time T2, when the potential of the wiring 121[$n$] is set to "L", the transistors 101 and 111 are turned off, and the potentials of the node NM[R], the node NM[G], and the node NM[B] are held. In the pixel 11R and the pixel 11G, the display is kept in accordance with the potential of the node NM[R] or the node NM[G] until the operation of the next frame.

When "$D_{2B}$" is supplied to the wiring 124[$m$+2] at time T2, the amount of change in potential of the other electrode of the capacitor 115, "$D_{2B}-V_0$", is added to the node NM[B] in accordance with the capacitance ratio of the capacitor 115 to the node NM[B]. This operation is an addition operation, and the potential of the node NM[B] becomes "$D_{1B}+(D_{2B}-V_0)$". At this time, when "$V_{ref}$"=0, the potential of the node NM[B] becomes "$D_{1B}+D_{2B}$".

Here, in the case where $D_{1B}=D_{2B}$ and the capacitance of the node NM[B] is sufficiently smaller than the capacitance of the capacitor 115, "$D_{1B}+D_{2B}$" becomes close to "$2D_{1B}$". Thus, a data potential approximately twice the data potential output from the data driver can be supplied to the display device.

At time T3, the potential of the wiring 122[$n$] is set to "L", whereby the transistor 112 is turned off, the potential of the node NM[B] is held, and the display is kept until an operation of the next frame. The above is the description of the operation of the pixel 10$a$. Through such an operation, a light-emitting device with a tandem structure can be operated even when a voltage input is small.

The pixel 10$a$ shown in FIG. 1 includes three subpixels, i.e., the pixel 11R, the pixel 11G, and the pixel 11B; however, the pixel 10$a$ may have a structure including a pixel 11W that emits white light as a subpixel. Adding the white color to the subpixels can improve the brightness of the screen, so that the same level of brightness can be achieved with less power than the case where the pixel 10$a$ is used. The total number of pixels would increase, so it is suitable for the use in large-screen televisions, digital signage, and the like.

Figure 4A:
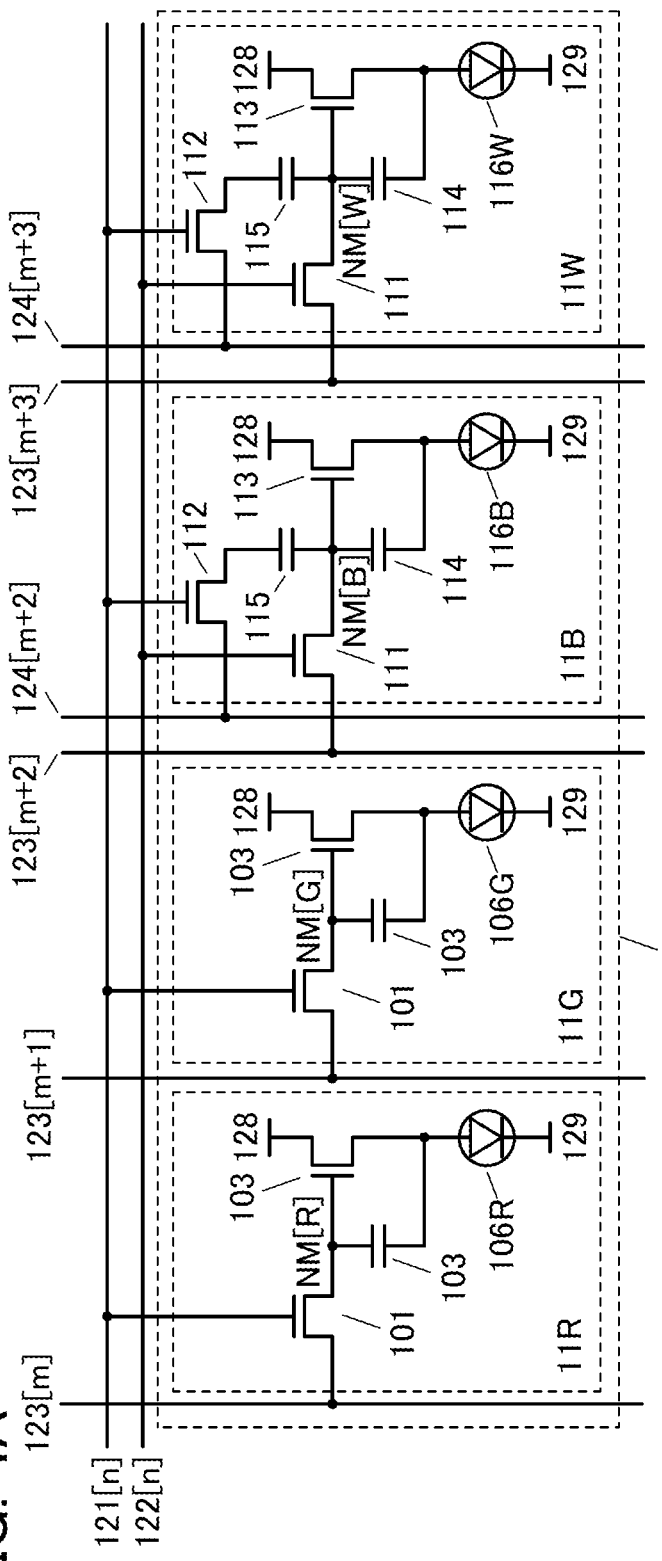
FIG. 4(A) is a diagram illustrating a pixel circuit.

FIG. 4(A) illustrates a pixel 10$b$ including four subpixels, i.e., the pixel 11R, the pixel 11G, the pixel 11B, and the pixel 11W. The pixel 10$b$ has a structure that additionally includes a subpixel, the pixel 11W, in the n-th row and the m+3-th column to the three subpixels included in the pixel 10$a$. The circuit configuration of the pixel 11W is equivalent to that of the pixel 11B, and includes a light-emitting device 116W that emits white light.

In order to obtain white light emission, a light-emitting device capable of light emission of three colors including red, green, and blue colors, a light-emitting device capable of light emission of two colors that are complementary to each other, or the like can be used. Thus, a tandem structure is preferred, similarly to the blue light-emitting device described above. Here, a case is assumed and described where a light-emitting device with a three-layer tandem structure including light-emitting units of red, green, and blue colors is used as the light-emitting device 116W that emits white light.

The pixel 11W has a configuration equivalent to that of the pixel 11B as illustrated in FIG. 4(A), and is electrically connected to a wiring 123[$m$+3] and a wiring 124[$m$+3].

Figure 5:
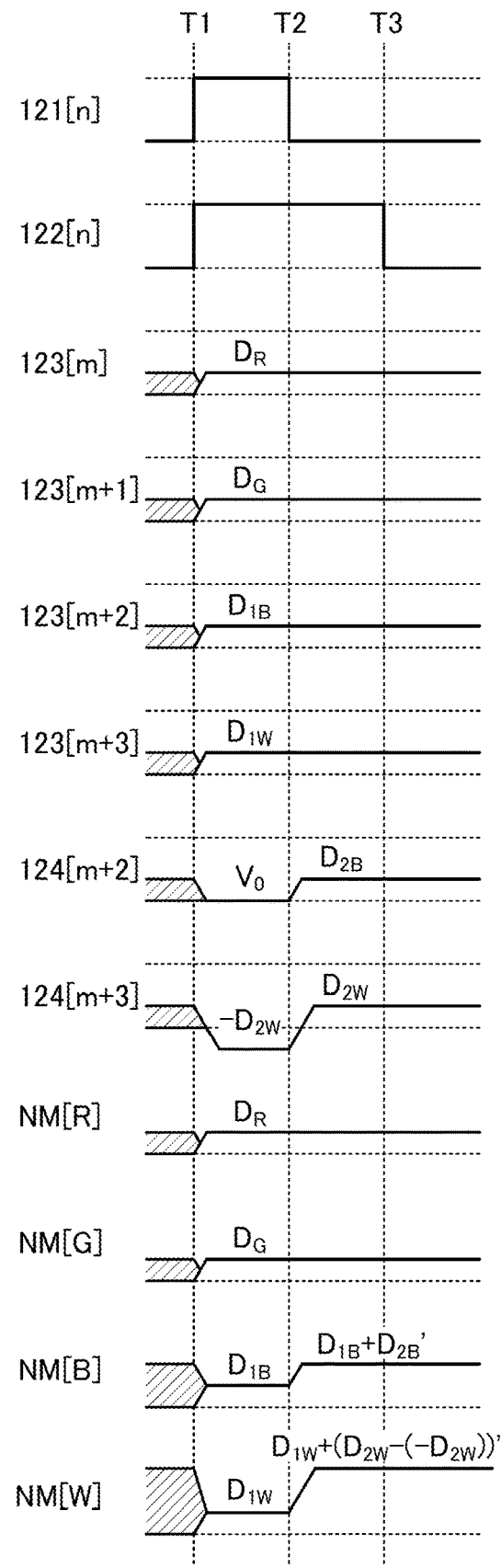
FIG. 5 is a timing chart showing the operation of a pixel circuit.

An example of the operation of the pixel 10$b$ illustrated in FIG. 4(A) is described with reference to the timing chart shown in FIG. 5. Note that the detailed description that is common with the pixel 10$a$ will be omitted. In the following description, first data (corresponding to weight) supplied to the pixel 11[W] is referred to as "$D_{1W}$", and second data (corresponding to data) is referred to as "$D_{2W}$".

Since light emission of the three-layer tandem light-emitting device requires a higher voltage than a two-layer tandem light-emitting device, the operation in which the potential of the node NM[W] becomes "$3D_{1W}$" is described here.

The basic operations of the pixel 11R, the pixel 11G, and the pixel 11B are the same as those in the pixel 10$a$; thus, only the operation of the pixel 11W is described here.

At time T1, when the potential of the wiring 121[$n$] is set to "H" and the potential of the wiring 122[$n$] is set to "H", the transistor 111 and the transistor 112 are turned on in the pixel 11W.

At time T1, "$D_{1W}$" supplied to the wiring 123[$m$+3] is written to the node NM[W] in the pixel 11[W].

The potential of the other electrode of the capacitor 115 is set to "$-D_{2W}$", a potential supplied to the wiring 124[$m$+3]. This operation is a reset operation for an addition operation (capacitive coupling operation) to be performed later. At this time, "$D_{1W}-(-D_{2W})$" is held in the capacitor 115.

At time T2, when the potential of the wiring 121[$n$] is set to "L", the transistor 111 is turned off, and the potential of the node NM[W] is held.

When "$D_{2W}$" is supplied to the wiring 124[$m$+3] at time T2, the amount of change in potential of the other electrode of the capacitor 115, "$D_{2W}-(-D_{2W})$", is added to the potential node NM[W] in accordance with the capacitance ratio of the capacitor 115 to the node NM[W]. This operation is an addition operation, and the potential of the node NM[W] becomes "$D_{1W}+(D_{2W}-(-D_{2W}))$".

Here, when $D_{1W}=D_{2W}$ and the capacitance of the node NM[W] is sufficiently smaller than the capacitance of the capacitor 115, "$D_{1W}+(D_{2W}-(-D_{2W}))$" becomes close to "3D$_{1W}$". Thus, a data potential approximately triple the data potential output from the data driver can be supplied to the display device.

At time T3, the potential of the wiring 122[n] is set to "L", whereby the transistor 112 is turned off, the potential of the node NM[W] is held, and the display is kept until an operation of the next frame. The above is the description of the operation of the pixel 11W in the pixel 10b. Through such an operation, even a light-emitting device with a three-layer tandem structure can be operated with a small input voltage.

Figure 4C:
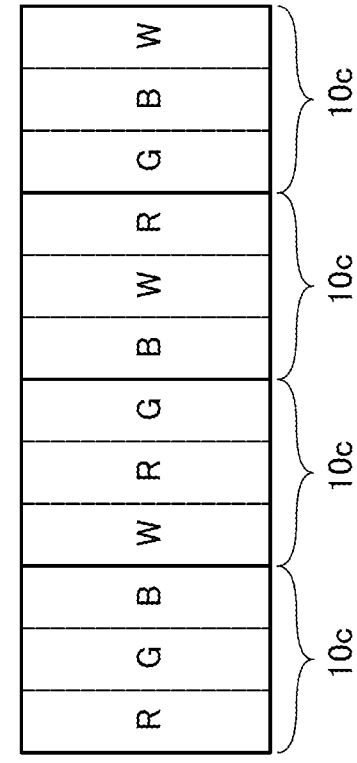
FIGS. 4(B) and 4(C) are diagrams illustrating combinations of subpixels.
Figure 4B:
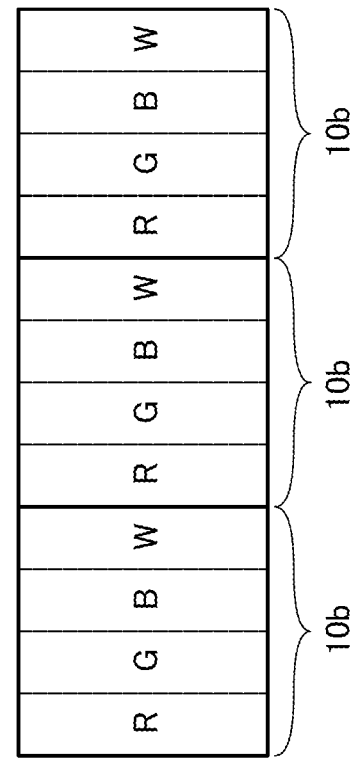

Note that in the pixel 10b, subpixels that emit light of four colors in total, i.e., R (red), G (green), B (blue), and W (white), constitute the pixel as shown in FIG. 4(B). As another variation, subpixels that emit light of three colors by combinations of RGB, WRG, BWR, and GBW may constitute a pixel as in a pixel 10c shown in FIG. 4(C). The color configuration of subpixels is not limited to RGBW. Other than RGBW, a subpixel that emits any one or more colors such as Y (yellow), M (magenta), and C (cyan) can be included to constitute a pixel, for example.

One embodiment of the present invention can also be used in a pixel circuit with a configuration that is different from FIG. 1 or FIG. 4(A). Note that the following description will describe the pixel 11B; however, the other pixels can also have a similar configuration.

Figure 6A:
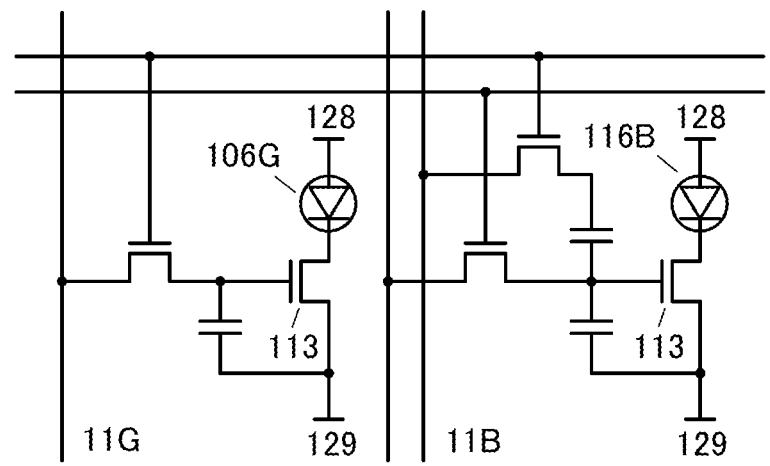
FIGS. 6(A) and 6(B) are diagrams each illustrating a pixel circuit.

As illustrated in FIG. 6(A), for example, one electrode of the light-emitting device 116B may be electrically connected to the wiring 128, and the other electrode of the light-emitting device 116B may be electrically connected to the other of the source and the drain of the transistor 113.

Figure 6B:
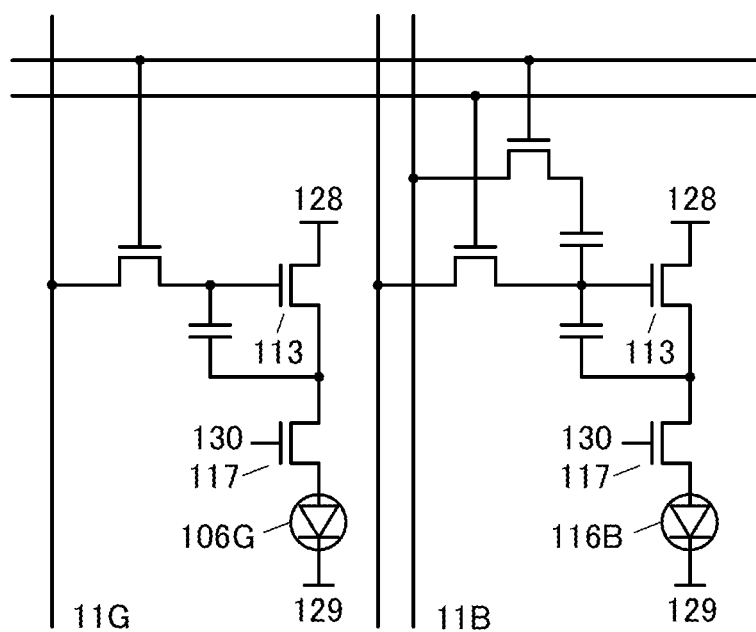

As illustrated in FIG. 6(B), a configuration in which a transistor 117 is added to the configuration of FIG. 1 or FIG. 4(A) may be employed. One of a source and a drain of the transistor 117 is electrically connected to the one of the source and the drain of the transistor 113. The other of the source and the drain of the transistor 117 is electrically connected to the one electrode of the light-emitting device 116B. A gate of the transistor 117 is electrically connected to a wiring 130. The wiring 130 can have a function of a signal line that controls the conduction of the transistor.

In this configuration, a current flows through the light-emitting device 116B when the potential of the node NM[B] is higher than or equal to the threshold voltage of the transistor 113 and the transistor 117 is turned on. Thus, through the control of the conduction of the transistor 117, light emission of the light-emitting device 116B can be started at any time after the operation of adding the weight (W) and the data (D).

Figure 7A:
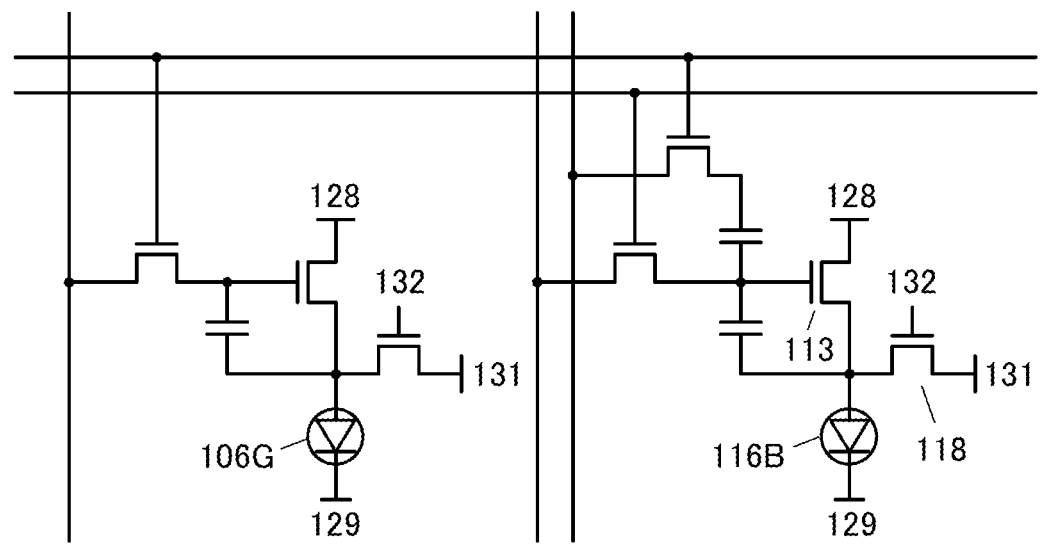
FIGS. 7(A) and 7(B) are diagrams each illustrating a pixel circuit.

As illustrated in FIG. 7(A), a configuration in which a transistor 118 is added to the configuration of FIG. 1 or FIG. 4(A) may be employed. One of a source and a drain of the transistor 118 is electrically connected to the one of the source and the drain of the transistor 113. The other of the source and the drain of the transistor 118 is electrically connected to a wiring 131. A gate of the transistor 118 is electrically connected to a wiring 132. The wiring 132 can have a function of a signal line that controls the conduction of the transistor.

The wiring 131 can be electrically connected to a supply source of a certain potential such as a reference potential. The certain potential is supplied from the wiring 131 to the one of the source and the drain of the transistor 113, whereby the source potential of the transistor 113 is set and write of image data can be stable. Furthermore, the timing of light emission of the light-emitting device 116B can be controlled.

In addition, the wiring 131 can be connected to an external circuit and can also have a function of a monitor line. The external circuit can have one or more of a function of the supply source of a certain potential, a function of obtaining electric characteristics of the transistor 111, and a function of generating correction data.

Figure 7B:
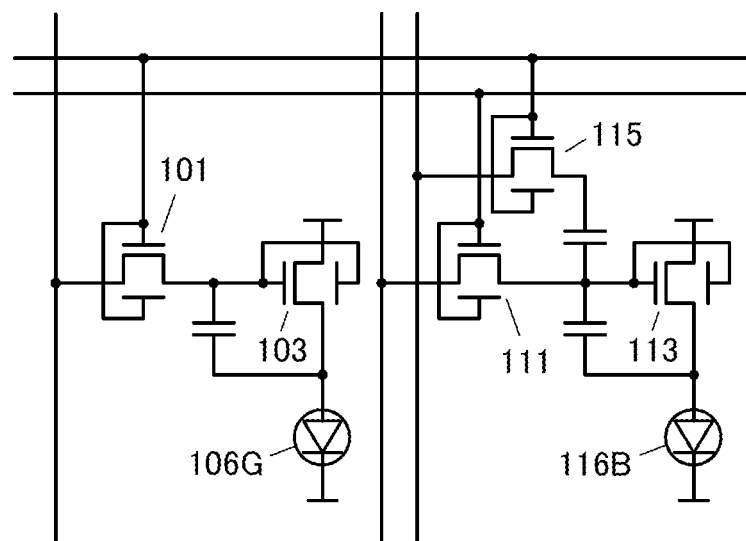

In the pixel circuit of one embodiment of the present invention, as illustrated in FIG. 7(B), a configuration in which transistors are provided with back gates may be employed. FIG. 7(B) shows a configuration in which the back gates are electrically connected to the front gates, which has an effect of increasing on-state currents. Alternatively, a configuration in which the back gates are electrically connected to wirings capable of supplying a constant potential may be employed. This configuration enables control of the threshold voltages of the transistors. This configuration can be used in the configurations of FIGS. 6(A) and 6(B) and FIG. 7(A).

Figure 8:
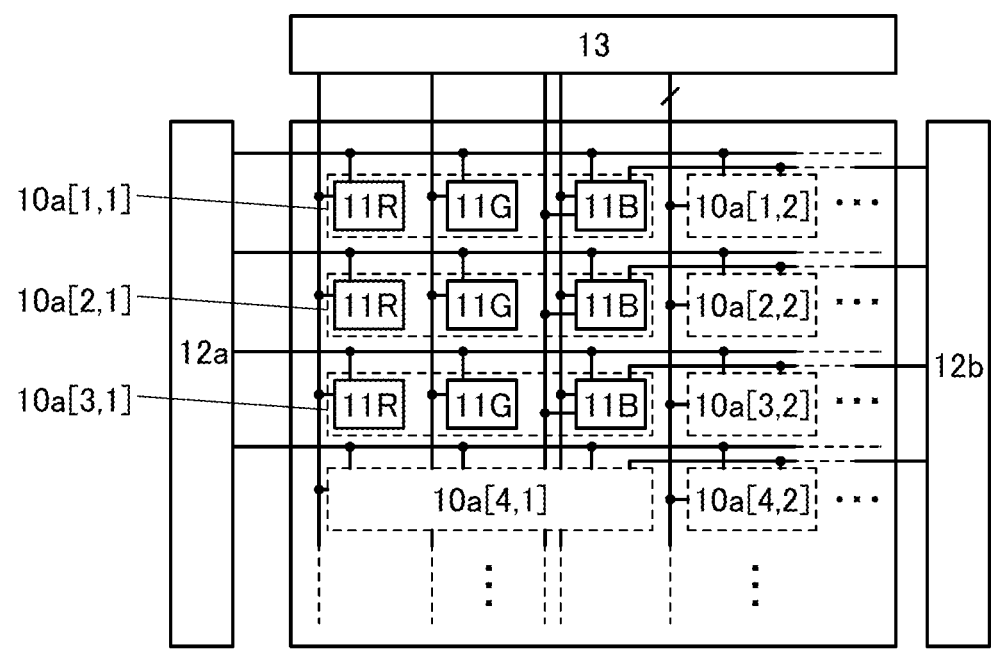
FIG. 8 is a block diagram illustrating a display apparatus.

FIG. 8 is a block diagram illustrating a display apparatus of one embodiment of the present invention. The display apparatus includes the pixels 10a arranged in the column direction and the row direction, a gate driver 12a, a gate driver 12b, and a source driver (data driver) 13. The gate driver 12a is electrically connected to the pixel 11R, the pixel 11G, and the pixel 11B. The gate driver 12b is electrically connected to the pixel 11B. The source driver 13 is electrically connected to the pixel 11R, the pixel 11G, and the pixel 11B. Although an example in which the gate driver is separated, a mode in which all the pixels are connected to a single gate driver may also be employed.

For the gate drivers 12a and 12b and the source driver 13, shift registers can be used, for example. Alternatively, a configuration in which a shift register and a buffer circuit are combined may be employed. When the conduction of the buffer circuit is controlled, a driving signal or image data can be selectively output to an intended wiring.

Although the display apparatus in which the pixel 10a is used is described as an example above, the display apparatus in which the pixel 10b or the pixel 10c is used can have a similar configuration.

This embodiment can be implemented in combination with any of the configurations described in the other embodiments and the like, as appropriate.

Embodiment 2

In this embodiment, structure examples of a display apparatus using a display device will be described. Note that the components, operations, and functions of the display apparatus described in Embodiment 1 are not repeatedly described in this embodiment.

Figure 9A:
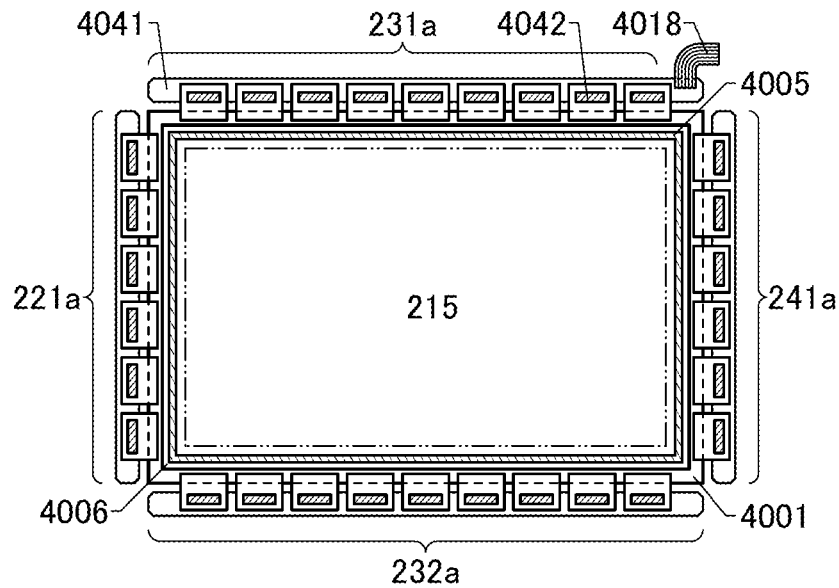
FIGS. 9(A) to 9(C) are diagrams each illustrating a display apparatus.
Figure 9B:
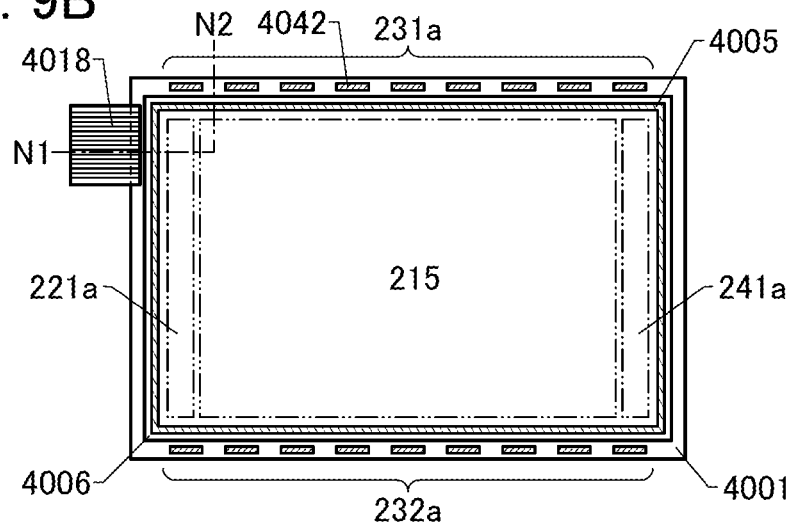
Figure 9C:
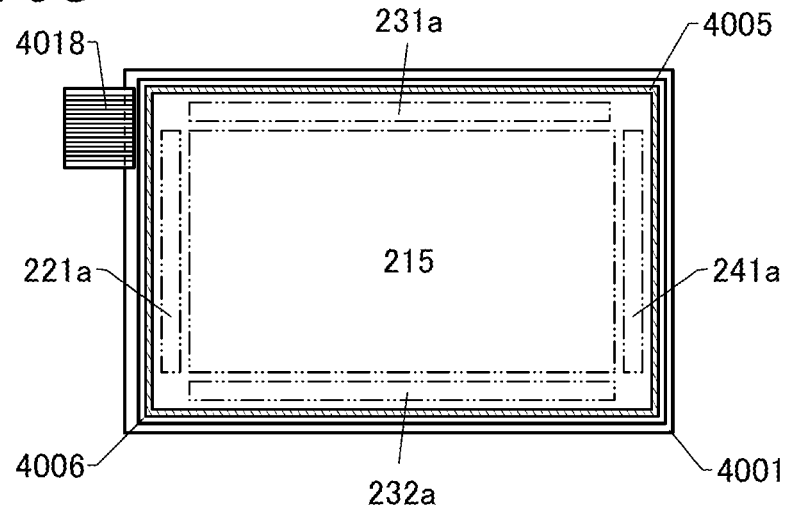

FIGS. 9(A) to 9(C) each show the structure of a display apparatus in which one embodiment of the present invention can be used.

In FIG. 9(A), a sealant 4005 is provided to surround a display portion 215 provided over a first substrate 4001. The display portion 215 is sealed with the sealant 4005 and a second substrate 4006.

The pixel illustrated in FIG. 1 or FIG. 4 of Embodiment 1 can be provided in the display portion 215. Note that a scan line driver circuit and a signal line driver circuit which will be described below correspond to the gate driver and the source driver, respectively.

In FIG. 9(A), a scan line driver circuit 221a, a signal line driver circuit 231a, a signal line driver circuit 232a, and a common line driver circuit 241a each include a plurality of integrated circuits 4042 provided over a printed circuit board

4041. The integrated circuits 4042 are each formed using a single crystal semiconductor or a polycrystalline semiconductor. The signal line driver circuit 231a and the signal line driver circuit 232a each function as the source driver described in Embodiment 1. The scan line driver circuit 221a functions as the gate driver described in Embodiment 1. The common line driver circuit 241a has a function of supplying a predetermined potential to the power supply line described in Embodiment 1.

Signals and potentials are supplied to the scan line driver circuit 221a, the common line driver circuit 241a, the signal line driver circuit 231a, and the signal line driver circuit 232a through a flexible printed circuit (FPC) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not limited; a wire bonding method, a chip on glass (COG) method, a tape carrier package (TCP) method, a chip on film (COF) method, or the like can be used.

FIG. 9(B) shows an example in which the integrated circuits 4042 included in the signal line driver circuit 231a and the signal line driver circuit 232a are mounted by a COG method. Some or all of the driver circuits can be formed over the substrate where the display portion 215 is formed, whereby a system-on-panel can be obtained.

In the example shown in FIG. 9(B), the scan line driver circuit 221a and the common line driver circuit 241a are formed over the substrate where the display portion 215 is formed. When the driver circuits are formed concurrently with pixel circuits in the display portion 215, the number of components can be reduced and accordingly the productivity can be increased.

In FIG. 9(B), the sealant 4005 is provided to surround the display portion 215, the scan line driver circuit 221a, and the common line driver circuit 241a over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with display devices with the use of the first substrate 4001, the sealant 4005, and the second substrate 4006.

Although the signal line driver circuit 231a and the signal line driver circuit 232a are separately formed and mounted on the first substrate 4001 in the example shown in FIG. 9(B), one embodiment of the present invention is not limited to this structure. The scan line driver circuit may be separately formed and then mounted, or part of the signal line driver circuits or part of the scan line driver circuits may be separately formed and then mounted. The signal line driver circuit 231a and the signal line driver circuit 232a may be formed over the substrate over which the display portion 215 is formed, as shown in FIG. 9(C).

In some cases, the display apparatus encompasses a panel in which the display device is sealed, and a module in which an IC or the like including a controller is mounted on the panel.

The display portion and the scan line driver circuit over the first substrate each include a plurality of transistors. Transistors included in the peripheral driver circuits and transistors included in the pixel circuit of the display portion may have the same structure or different structures. The transistors included in the peripheral driver circuits may be transistors having the same structure or transistors having two or more different structures used in combination. Similarly, the transistors included in the pixel circuit may be transistors having the same structure or transistors having two or more different structures used in combination.

An input device can be provided over the second substrate 4006. The function of a touch panel can be obtained in the structure in which the input device is added to the display apparatus shown in FIG. 9.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element will be described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display apparatus and a sensor element that are separately formed are attached to each other and a structure in which an electrode and the like included in a sensor element are provided on one or both of a substrate supporting a display device and a counter substrate.

Figure 10A:
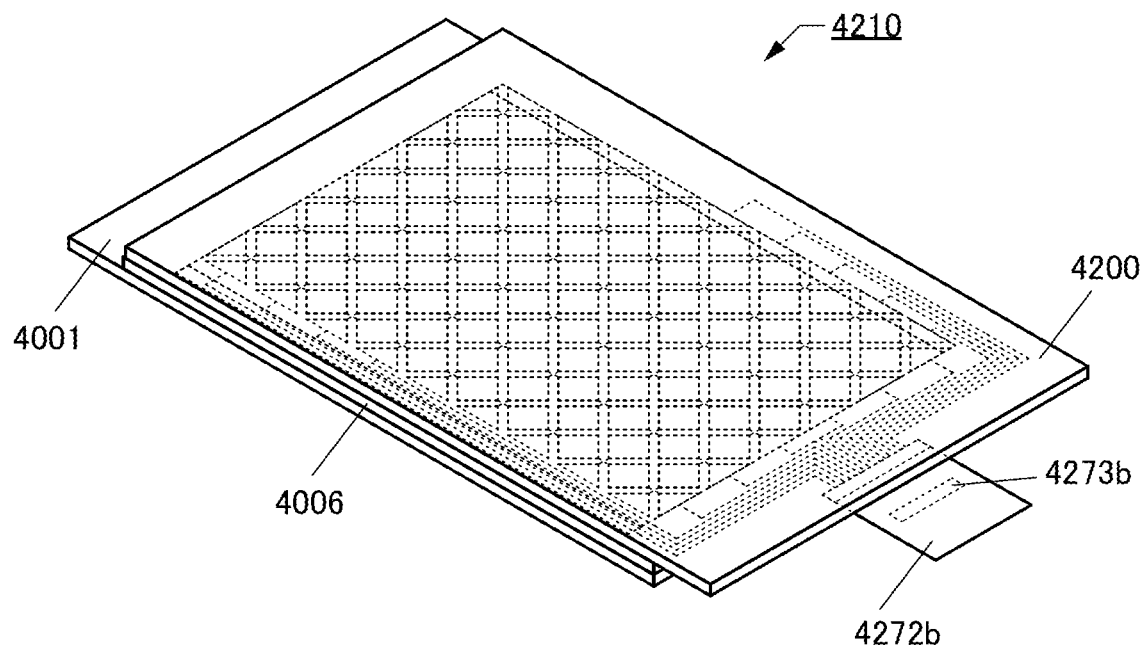
FIGS. 10(A) and 10(B) are diagrams illustrating a touch panel.
Figure 10B:
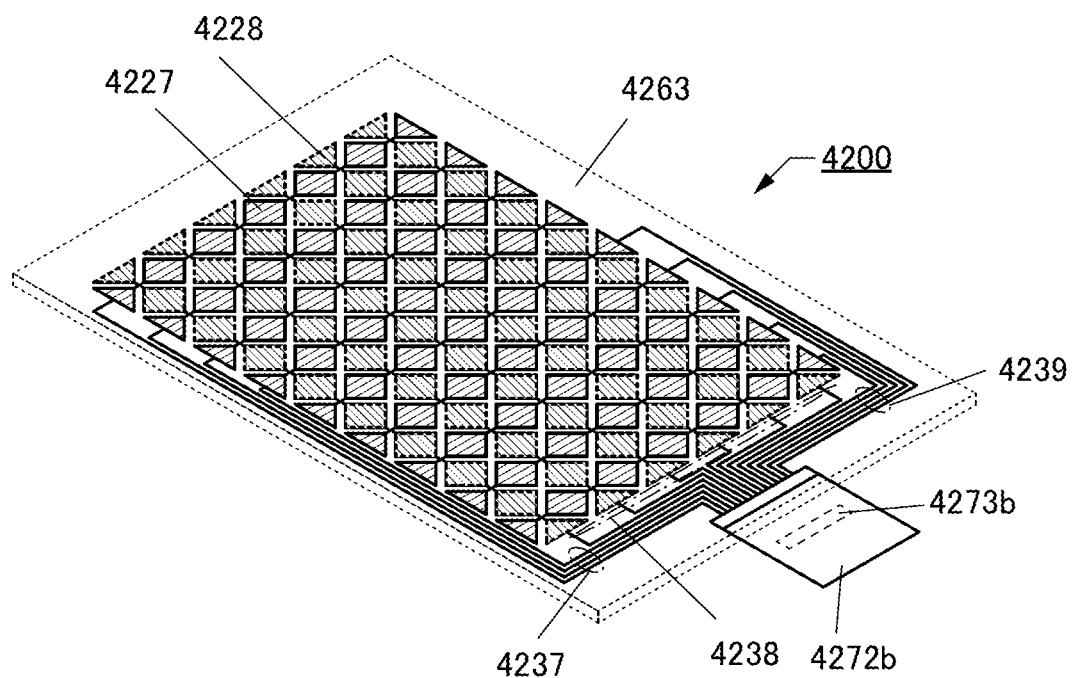

FIGS. 10(A) and 10(B) show an example of the touch panel. FIG. 10(A) is a perspective view of a touch panel 4210. FIG. 10(B) is a schematic perspective view of the input device 4200. Note that for simplicity, FIGS. 10(A) and 10(B) show only the major components.

The touch panel 4210 has a structure in which a display apparatus and a sensor element that are fabricated separately are attached to each other. The touch panel 4210 includes the input device 4200 and the display apparatus, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4238. In addition, the electrode 4228 can be electrically connected to the wiring 4239. An FPC 4272b is electrically connected to each of the plurality of wirings 4237 and the plurality of wirings 4238 and wirings 4239. An IC 4273b can be provided on the FPC 4272b.

A touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be used.

FIG. 11(A) and FIG. 11(B) are cross-sectional views of a portion indicated by the chain line N1-N2 in FIG. 9(B). FIG. 11(A) illustrates a top-emission display apparatus that emits light in a direction of the second substrate 4006, and FIG. 11(B) illustrates a bottom-emission display apparatus that emits light in a direction of the first substrate 4001. One embodiment of the present invention can be used in either of the above types. One embodiment of the present invention can also be used in a dual-emission display apparatus that emits light in the direction of the first substrate 4001 and in the direction of the second substrate 4006.

Display apparatuses shown in FIG. 11(A) and FIG. 11(B) each include an electrode 4015, and the electrode 4015 is electrically connected to a terminal included in an FPC 4018 through an anisotropic conductive layer 4019. In FIG. 11(A) and FIG. 11(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors. In FIG. 11(A) and FIG. 11(B), the transistor 4010 included in the display portion 215 and the transistor 4011 included in the scan line driver circuit 221a are shown as examples. In the examples shown in FIG. 11(A) and FIG. 11(B), the transistor 4010 and the transistor 4011 are bottom-gate transistors but may be top-gate transistors.

In FIG. 11(A) and FIG. 11(B), the insulating layer 4112 is provided over the transistor 4010 and the transistor 4011. A partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display apparatuses illustrated in FIGS. 11(A) and 11(B) each include a capacitor 4020. The capacitor 4020 includes an electrode 4021 formed in the same step as a gate electrode of the transistor 4010, and an electrode formed in the same step as the source electrode and the drain electrode. The electrodes overlap with each other with an insulating layer 4103 therebetween.

In general, the capacitance of a capacitor provided in a pixel portion of a display apparatus is set in consideration of the leakage current or the like of transistors provided in the pixel portion so that charges can be held for a predetermined period. The capacitance of the capacitor may be set in consideration of the off-state current of the transistors or the like.

The transistor 4010 provided in the display portion 215 is electrically connected to the display device.

The display apparatuses shown in FIG. 11(A) and FIG. 11(B) each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

As the display device included in the display apparatus, a light-emitting device utilizing electroluminescence (EL element) can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer and the light-emitting substance contained in the EL layer emits light.

As the EL element, an organic EL element or an inorganic EL element can be used, for example. Note that an LED (including a mini LED or a micro LED) that uses a compound semiconductor as a light-emitting material is one of EL elements, and the LED can also be used.

In an organic EL element, by voltage application, electrons are injected from one electrode to the EL layer and holes are injected from the other electrode to the EL layer. Then, the carriers (electrons and holes) are recombined, the light-emitting organic compound forms an excited state, and light is emitted when the excited state returns to aground state. Owing to such a mechanism, this light-emitting device is referred to as a current-excitation light-emitting device.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions.

As the light-emitting device, a micro LED using a compound semiconductor may be used. Note that the description is made here using an organic EL element as the light-emitting device.

A light-emitting device 4513 serving as the display device is electrically connected to the transistor 4010 provided in the display portion 215. Note that the structure of the light-emitting device 4513 is a stacked-layer structure including the first electrode layer 4030, an EL layer 4511, and the second electrode layer 4031; however, this embodiment is not limited to this structure. The structure of the light-emitting device 4513 can be changed as appropriate depending on the direction in which light is extracted from the light-emitting device 4513, or the like. To extract light emitted from the light-emitting device 4513, at least one of the pair of electrodes in the light-emitting device 4513 has a light-transmitting property.

The partition wall 4510 is formed using an organic insulating material or an inorganic insulating material. Specifically, it is preferable that the partition wall 4510 be formed in such a manner that it is formed using a photosensitive resin material, and an opening portion is formed over the first electrode layer 4030 such that a side surface of the opening portion slopes with continuous curvature.

For a top emission type, a wiring 4515 may be provided over the partition wall 4510 as shown in FIG. 12(A). For the top emission type, the second electrode layer 4031 is provided as a common electrode. Since the second electrode layer 4031 is formed on the side to which light is emitted, a light-transmitting conductive film is used for the second electrode layer 4031. An oxide conductive film or the like with a higher resistance than a metal is used as the light-transmitting conductive film, which sometimes leads to a voltage drop and causes the display quality to be uneven within the plane of the display portion.

Thus, the wiring 4515 is formed using a low-resistance material such as a metal, and the wiring 4515 and the second electrode layer 4031 are in direct contact with each other. With such a structure, the wiring 4515 can function as an auxiliary wiring for practically decreasing the resistance of the second electrode layer 4031, and the display quality can be improved.

Note that the wiring 4515 may be provided over the insulating layer 4112 as shown in FIG. 12(B). With such a structure, the wiring 4515 can be formed by utilizing the step of forming the first electrode layer 4030. Alternatively, the wiring 4515 may be formed by utilizing the step of forming a gate electrode of the transistor. Alternatively, the wiring 4515 may be formed by utilizing the step of forming a source electrode (drain electrode) of the transistor. Alternatively, the wiring 4515 may be formed over the second electrode layer 4031.

Figure 13A:
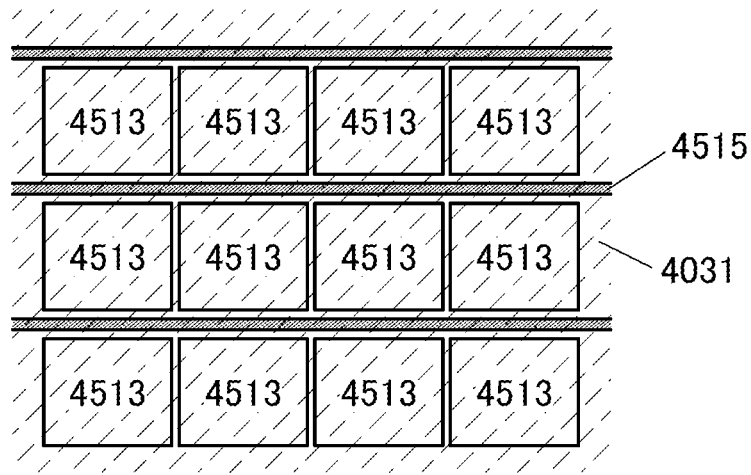
FIGS. 13(A) to 13(C) are diagrams each illustrating auxiliary wirings.
Figure 13B:
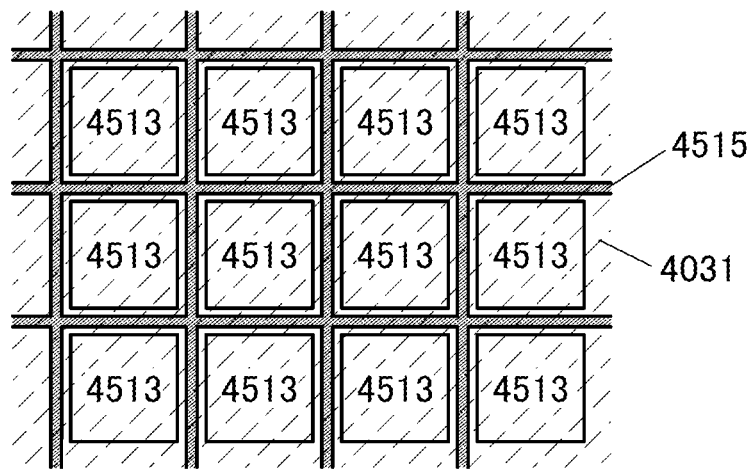
Figure 13C:
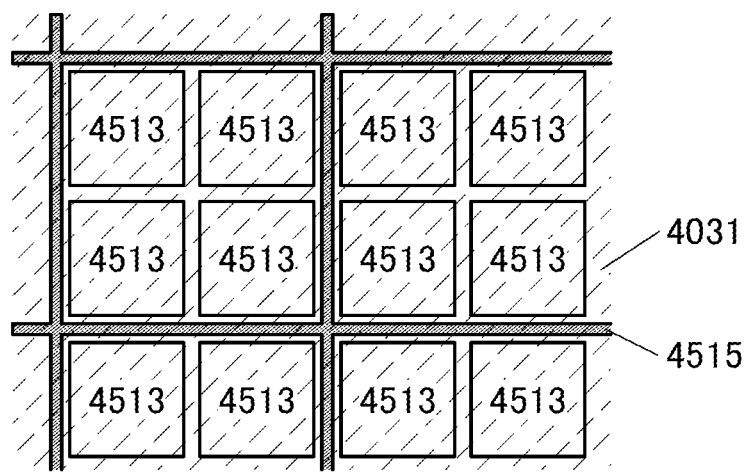

The wiring 4515 can be provided in a region not overlapping with the light-emitting device 4513 as illustrated in FIGS. 13(A) to 13(C). FIGS. 13(A) to 13(C) each show a portion of the top view of the display portion. The wiring 4515 can be provided so as to extend in the row direction or in the column direction of the display portion as illustrated in FIG. 13(A), for example. Alternatively, the wiring 4515 may be provided so as to extend in the row direction and the column direction as illustrated in FIG. 13(B). Note that the intervals at which the wiring 4515 is provided do not have to be intervals of the light-emitting devices 4513 (intervals of pixels), and the wiring 4515 may be provided at intervals such that a plurality of light-emitting devices 4513 is sandwiched therebetween as shown in FIG. 13(C).

Figure 14A:
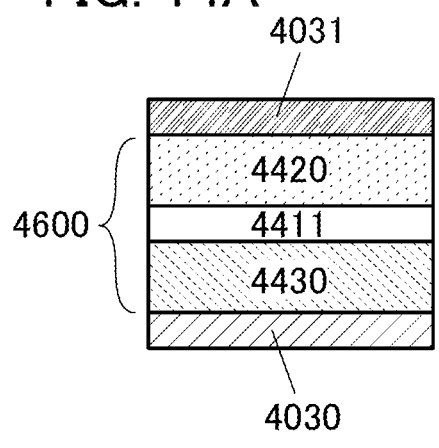
FIGS. 14(A) to 14(C) are diagrams each illustrating a light-emitting device.

The EL layer 4511 can be formed of a plurality of layers such as a layer 4420, a light-emitting layer 4411, and a layer 4430, as shown in FIG. 14(A). The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can serve as a single light-emitting unit 4600, and the structure in FIG. 14(A) is referred to as a single structure in this specification.

Figure 14B:
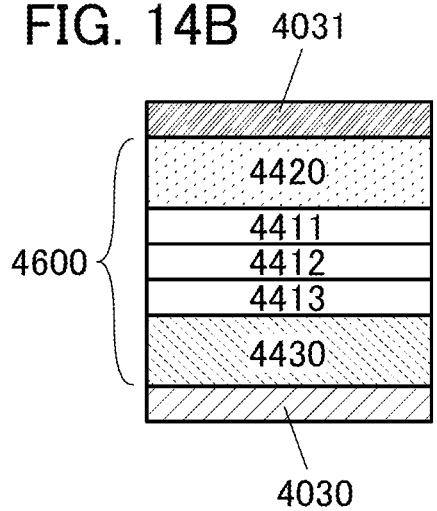

Note that the structure in which a plurality of light-emitting layers (light-emitting layers 4411, 4412, and 4413) is provided between the layer 4420 and the layer 4430 as shown in FIG. 14(B) is another variation of the single structure.

Figure 14C:
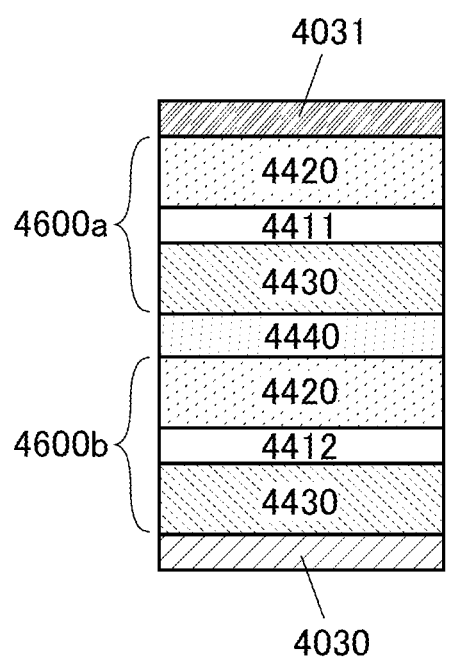

The structure in which a plurality of light-emitting units 4600 (light-emitting units 4600a and 4600b) is connected in series with an intermediate layer (charge-generation layer) 4440 therebetween as shown in FIG. 14(C) is referred to as a tandem structure in this specification. For the two-layer tandem blue light-emitting device described in Embodiment 1, the structure shown in FIG. 14(C) is employed; a light-emitting layer that exhibits a blue color is used as the light-emitting layer 4411 included in the light-emitting unit 4600a and the light-emitting layer 4412 included in the light-emitting unit 4600b. In this specification and the like, the structure shown in FIG. 14(C) is referred to as a tandem structure; however, without being limited to this, a tandem structure may be referred to as a stack structure, for example.

The emission color of the light-emitting device 4513 can be red, green, blue, cyan, magenta, yellow, white, or the like depending on the material that constitutes the EL layer 4511. Furthermore, the color purity can be further increased when the light-emitting device 4513 has a microcavity structure.

The light-emitting device that emits white light preferably contains two or more kinds of light-emitting substances in the light-emitting layer. To obtain white light emission, two or more kinds of light-emitting substances are selected such that their emission colors are complementary.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

The light-emitting device preferably emits light with a spectrum having two or more peaks in the wavelength range of a visible light region (e.g., 350 nm to 750 nm). The emission spectrum of a material that emits light having a peak in a yellow wavelength range preferably includes spectral components also in a green wavelength range and/or a red wavelength range.

Specifically, as illustrated in FIGS. 15(A) to 15(D), the EL layer 4511 can have a two-layer tandem structure in which a light-emitting unit 4610 containing a light-emitting substance that emits blue light and a light-emitting unit 4620 containing a light-emitting substance that emits light of yellow, which is complementary to blue, are connected in series.

Figure 15A:
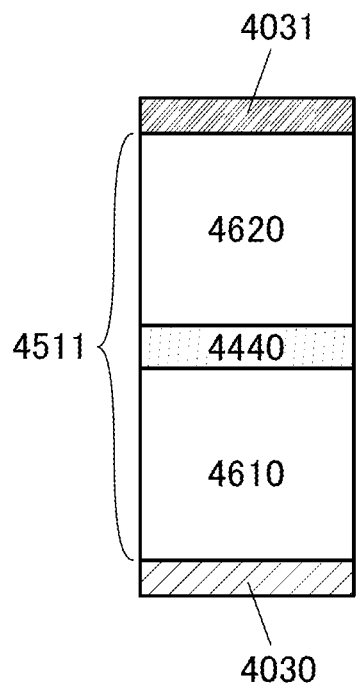
FIGS. 15(A) to 15(D) are diagrams each illustrating a light-emitting device.
Figure 15B:
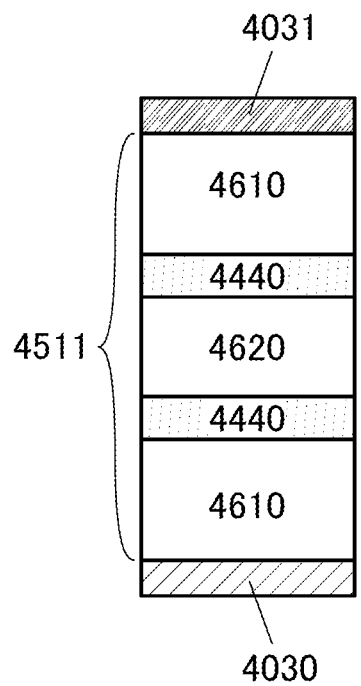

Alternatively, the light-emitting unit 4620 may have a three-layer tandem structure in which the light-emitting unit 4620 is sandwiched between the light-emitting units 4610 as illustrated in FIG. 15(B).

Figure 15C:
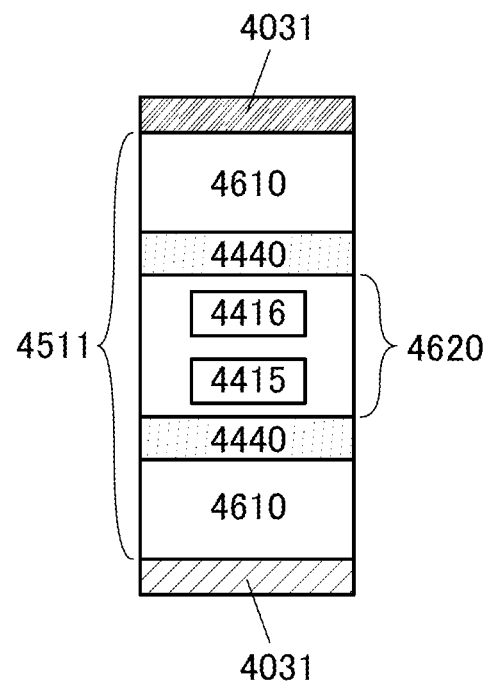

The light-emitting unit 4620 may have a structure including a light-emitting layer 4415 and a light-emitting layer 4416 as illustrated in FIG. 15(C). The light-emitting layer 4415 and the light-emitting layer 4416 emit light of different colors and can each be any of a layer containing a light-emitting substance that emits yellow light, a layer containing a light-emitting substance that emits red light, and a layer containing a light-emitting substance that emits green light.

Figure 15D:
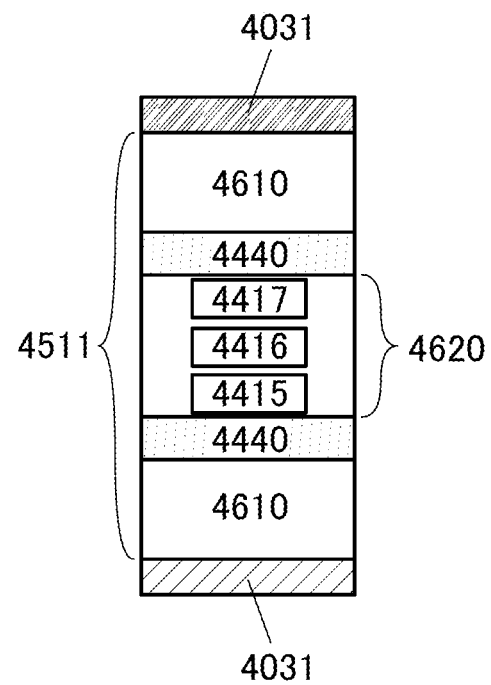

The light-emitting unit 4620 may have a structure including the light-emitting layer 4415, the light-emitting layer 4416, and a light-emitting layer 4417 as illustrated in FIG. 15(D). The light-emitting layers 4415, the light-emitting layer 4416, and the light-emitting layer 4417 emit light of different colors and can each be any of a layer containing a light-emitting substance that emits yellow light, a layer containing a light-emitting substance that emits red light, and a layer containing a light-emitting substance that emits green light.

Providing a layer that emits red light and/or a layer that emits green light in addition to a layer that emits yellow light can widen the color gamut, improving display quality.

Note that the EL layer 4511 may contain an inorganic compound such as quantum dots. For example, when used for the light-emitting layer, the quantum dots can function as a light-emitting material.

As the quantum dot material, a colloidal quantum dot material, an alloyed quantum dot material, a core-shell quantum dot material, a core quantum dot material, or the like can be used. The material containing elements belonging to Groups 12 and 16, elements belonging to Groups 13 and 15, or elements belonging to Groups 14 and 16, may be used. Alternatively, the quantum dot material containing an element such as cadmium, selenium, zinc, sulfur, phosphorus, indium, tellurium, lead, gallium, arsenic, or aluminum may be used.

A protective layer may be formed over the second electrode layer 4031 and the partition wall 4510 in order to prevent entry of oxygen, hydrogen, moisture, carbon dioxide, or the like into the light-emitting device 4513. As the protective layer, silicon nitride, silicon nitride oxide, aluminum oxide, aluminum nitride, aluminum oxynitride, aluminum nitride oxide, DLC (Diamond Like Carbon), or the like can be formed. In a space which is sealed with the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover member in this manner with high air-tightness and little degasification so that the light-emitting device is not exposed to the outside air.

As the filler 4514, an ultraviolet curable resin or a thermosetting resin can be used as well as an inert gas such as nitrogen or argon; PVC (polyvinyl chloride), an acrylic-based resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a resin that is curable at room temperature (e.g., a two-component-mixture-type resin), a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film; for example, anti-glare treatment by which reflected light can be diffused by projections and depressions on a surface so as to reduce the glare can be performed.

For the first electrode layer and the second electrode layer (also referred to as a pixel electrode layer, a common electrode layer, a counter electrode layer, or the like) for applying voltage to the display device, a light-transmitting property or a light-reflecting property is selected in accordance with the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof, and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor included in the driver circuit of the display apparatus is easily broken by static electricity or the like, a protective circuit is preferably provided. The protective circuit is preferably formed using a nonlinear element.

This embodiment can be implemented in combination with any of the configurations described in the other embodiments and the like, as appropriate.

Embodiment 3

In this embodiment, examples of transistors which can be used as the transistors described in the above embodiments are described with reference to drawings.

The display device of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 16(A1) is a cross-sectional view of a channel-protective transistor 810, which is a type of bottom-gate transistor, in the channel length direction. In FIG. 16(A1), the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided over the insulating layer 726 to be partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744*a* and the electrode 744*b*. According to one embodiment of the present invention, a transistor with favorable electrical characteristics can be provided.

The transistor 810 includes an insulating layer 728 over the electrode 744*a*, the electrode 744*b*, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744*a* and the electrode 744*b* which are in contact with the semiconductor layer 742. The carrier concentration in the regions of the semiconductor layer 742 where oxygen vacancies are generated is increased, so that the regions become n-type regions (n$^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744*a* and the electrode 744*b*. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744*a* and between the semiconductor layer 742 and the electrode 744*b*. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 16(A2) is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or an arbitrary potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 16(B1) is a cross-sectional view of a channel-protective transistor 820, which has a structure different from FIG. 16(A1), in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744*a* through an opening portion formed by selectively removing part of the insulating layer 741 that overlaps with the semiconductor layer 742. The semiconductor layer 742 is electrically connected to the electrode 744*b* through another opening portion formed by selectively removing part of the insulating layer 741 that overlaps with the semiconductor layer 742. A region of the insulating layer 741 that overlaps with the channel formation region can function as a channel protective layer.

A transistor 821 illustrated in FIG. 16(B2) is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

A transistor illustrated in FIG. 16(C1) is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

A transistor 826 illustrated in FIG. 16(C2) is different from the transistor 825 in that the electrode 723 that can function as a back gate electrode is provided over the insulating layer 729.

FIGS. 17(A1) to 17(C2) are cross-sectional views of the transistors 810, 811, 820, 821, 825, and 826 in the channel width direction, respectively.

In each of the structures illustrated in FIGS. 17(B2) and 17(C2), the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 illustrated in FIG. 18(A1) is a type of top-gate transistor. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in a region of the semiconductor layer 742 which overlaps with the insulating layer 726 but does not overlap with the electrode 746.

A transistor 843 illustrated in FIG. 18(A2) is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 illustrated in FIG. 18(B1) and a transistor 845 illustrated in FIG. 18(B2), the insulating layer 726 in a region that does not overlap with the electrode 746 may be completely removed. Alternatively, as in a transistor 846 illustrated in FIG. 18(C1) and a transistor 847 illustrated in FIG. 18(C2), the insulating layer 726 may be left.

Also in the transistor 842 to the transistor 847, after the formation of the electrode 746, an impurity is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIGS. 19(A1) to 19(C2) are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the configurations described in the other embodiments and the like, as appropriate.

Embodiment 4

Examples of an electronic device that can use the display apparatus of one embodiment of the present invention include display equipment, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 20(A) to 20(F) illustrate specific examples of such electronic devices.

Figure 20A:
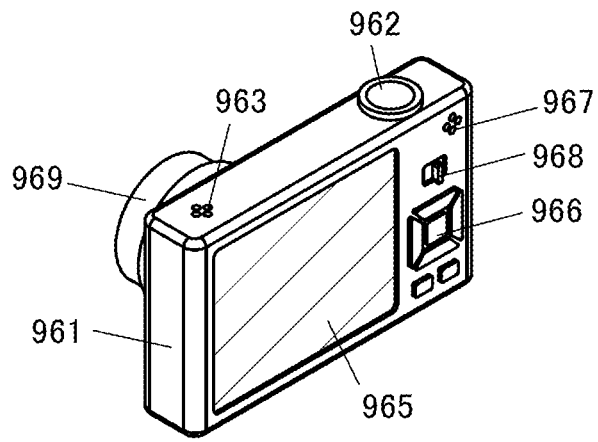
FIGS. 20(A) to 20(F) are diagrams each illustrating an electronic device.

FIG. 20(A) is a digital camera, which includes a housing 961, a shutter button 962, a microphone 963, a speaker 967, a display portion 965, an operation key 966, a zoom lever 968, a lens 969, and the like. The use of the display apparatus of one embodiment of the present invention for the display portion 965 enables display of a variety of images. The use of the pixel 10a, which is one embodiment of the present invention, in the display portion 965 is particularly suitable.

Figure 20B:
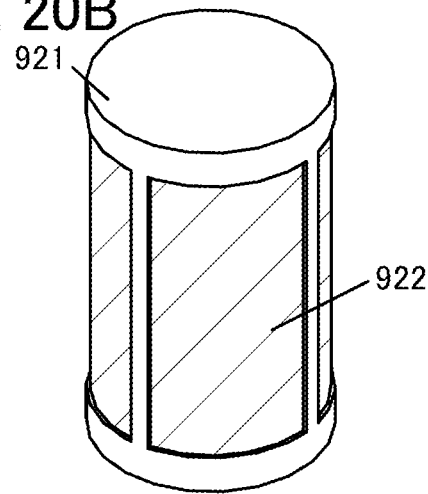

FIG. 20(B) is digital signage, which has a large display portion 922. The digital signage can be installed on the side surface of a pillar 921, for example. The use of the display apparatus of one embodiment of the present invention for the display portion 922 enables display with high display quality. The use of the pixel 10a, the pixel 10b, or the pixel 10c, which is one embodiment of the present invention, in the display portion 965 is particularly suitable.

Figure 20C:
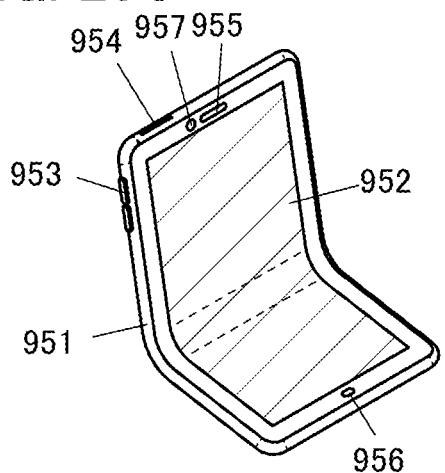

FIG. 20(C) is an example of a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as illustrated in the figure. The use of the display apparatus of one embodiment of the present invention for the display portion 952 enables display of a variety of images. The use of the pixel 10a, which is one embodiment of the present invention, in the display portion 965 is particularly suitable.

Figure 20D:
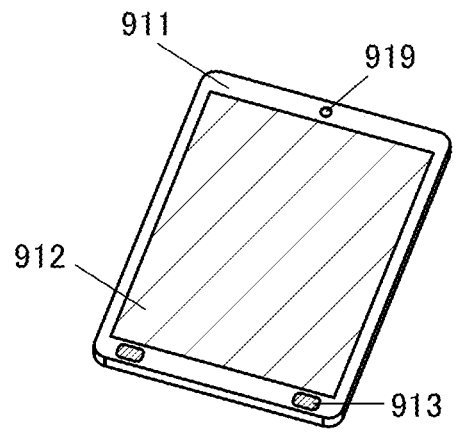

FIG. 20(D) is a portable data terminal, which includes a housing 911, a display portion 912, speakers 913, a camera 919, and the like. A touch panel included in the display portion 912 enables input and output of information. The use of the display apparatus of one embodiment of the present invention for the display portion 912 enables display of a variety of images. The use of the pixel 10a, which is one embodiment of the present invention, in the display portion 965 is particularly suitable.

Figure 20E:
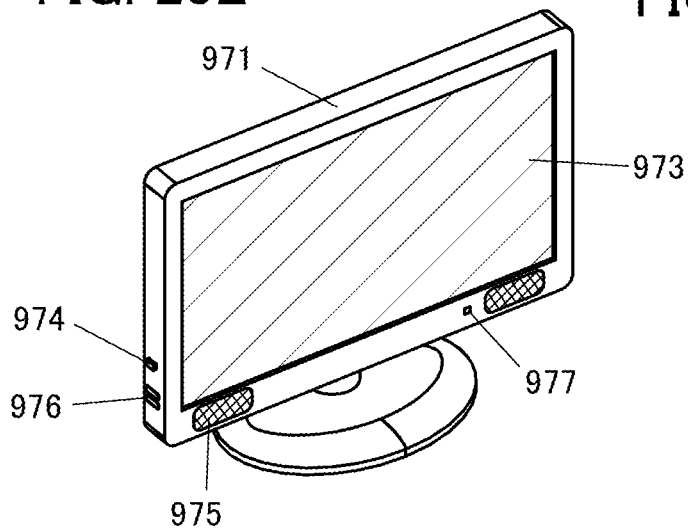

FIG. 20(E) is a television, which includes a housing 971, a display portion 973, an operation key 974, speakers 975, a communication connection terminal 976, an optical sensor 977, and the like. The display portion 973 includes a touch sensor that enables input operation. The use of the display apparatus of one embodiment of the present invention for the display portion 973 enables display of a variety of images. The use of the pixel 10a, the pixel 10b, or the pixel 10c, which is one embodiment of the present invention, in the display portion 973 is particularly suitable.

Figure 20F:
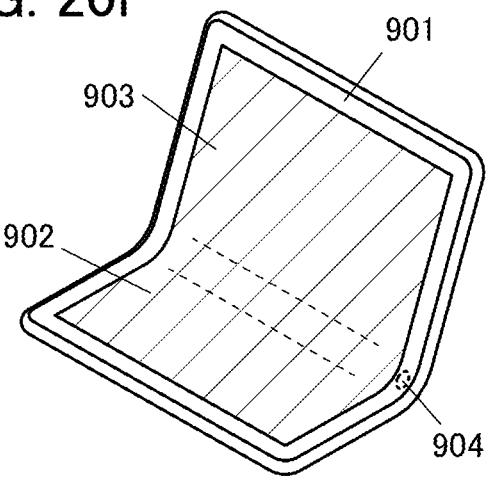

FIG. 20(F) illustrates an information processing terminal, which includes a housing 901, a display portion 902, a display portion 903, a sensor 904, and the like. The display portion 902 and the display portion 903 are composed of one display panel and flexible. The housing 901 is also flexible, can be used in a bent state, and can be used in a flat plate-like shape like a tablet terminal. The sensor 904 can sense the shape of the housing 901, and for example, it is possible to switch display on the display portion 902 and the display portion 903 when the housing is bent. The use of the display apparatus of one embodiment of the present invention for the display portion 902 and the display portion 903 enables display of a variety of images. The use of the pixel 10a, which is one embodiment of the present invention, in the display portion 902 and the display portion 903 is particularly suitable.

This embodiment can be implemented in combination with any of the configurations described in the other embodiments and the like, as appropriate.

REFERENCE NUMERALS

10a: pixel, 10b: pixel, 10c: pixel, 11: pixel, 11B: pixel, 11G: pixel, 11R: pixel, 11W: pixel, 12a: gate driver, 12b: gate driver, 13: source driver, 101: transistor, 102: transistor, 103: capacitor, 106G: light-emitting device, 106R: light-emitting device, 111: transistor, 112: transistor, 113: transistor, 114: capacitor, 115: capacitor, 116B: light-emitting device, 116W: light-emitting device, 117: transistor, 118: transistor, 119: diode, 120: light-emitting device, 121: wiring, 122: wiring, 123: wiring, 124: wiring, 128: wiring, 129: wiring, 130: wiring, 131: wiring, 132: wiring, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: display portion, 903: display portion, 904: sensor, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 4001: substrate, 4005: sealant, 4006: substrate, 4010: transistor, 4011: transistor, 4014: wiring, 4015: electrode, 4017: electrode, 4018: FPC, 4019: anisotropic conductive layer, 4020: capacitor, 4021: electrode, 4030: electrode layer, 4031: electrode layer, 4041: printed circuit board, 4042: integrated circuit, 4102: insulating layer, 4103: insulating layer, 4104: insulating layer, 4110: insulating layer, 4111: insulating layer, 4112: insulating layer, 4200: input device, 4210: touch panel, 4227: electrode, 4228: electrode, 4237: wiring, 4238: wiring, 4239: wiring, 4263: substrate, 4272b: FPC, 4273b: IC, 4411: light-emitting layer, 4412: light-emitting layer, 4413: light-emitting layer, 4415: light-emitting layer, 4416: light-emitting layer, 4417: light-emitting layer, 4420: layer, 4430: layer, 4510: partition wall, 4511: EL layer, 4513: light-emitting device, 4514: filler, 4515: wiring, 4600: light-emitting unit, 4600a: light-emitting unit, 4600b: light-emitting unit, 4610: light-emitting unit, 4620: light-emitting unit.

This application is based on Japanese Patent Application Serial No. 2018-154714 filed with Japan Patent Office on Aug. 21, 2018, the entire contents of which are hereby incorporated herein by reference.

What is claimed is:

1. A display apparatus comprising:
a pixel comprising a first subpixel, a second subpixel, and a third subpixel;
wherein the first subpixel comprises a first transistor, a second transistor, a third transistor, a first capacitor, a second capacitor, and a light-emitting device, wherein one of a source and a drain of the first transistor is electrically connected to one electrode of the first capacitor, wherein the one electrode of the first capacitor is electrically connected to one electrode of the second capacitor, wherein the other electrode of the second capacitor is electrically connected to one of a source and a drain of the second transistor, wherein the one electrode of the first capacitor is electrically connected to a gate of the third transistor, wherein one of a source and a drain of the third transistor is electrically connected to a first electrode of the light-emitting device, and wherein the light-emitting device has a tandem structure comprising two or more light-emitting units being connected in series between the first electrode and a second electrode, and wherein the first subpixel emits only blue light.

2. The display apparatus according to claim 1, wherein the first, second, and third transistors each comprise a metal oxide in a channel formation region, wherein the metal oxide comprises In, Zn, and M, and wherein M is Al, Ti, Ga, Sn, Y, Zr, La, Ce, Nd, or Hf.

3. The display apparatus according to claim 1, wherein one of the first electrode and the second electrode of the light-emitting device is a light-transmitting conductive film, and wherein the light-transmitting conductive film is in contact with a metal wiring that does not overlap with the light-emitting device.

4. The display apparatus according to claim 1, wherein the first subpixel is configured to:
store a first data;
add a second data to the first data to generate a third data; and
emit light based on the third data.

5. A display apparatus comprising:
a pixel comprising a first subpixel, a second subpixel, and a third subpixel,
wherein the first subpixel comprises a first transistor, a second transistor, a third transistor, a fourth transistor, a first capacitor, a second capacitor, and a light-emitting device,
wherein one of a source and a drain of the first transistor is electrically connected to one electrode of the first capacitor,
wherein the one electrode of the first capacitor is electrically connected to one electrode of the second capacitor,
wherein the other electrode of the second capacitor is electrically connected to one of a source and a drain of the second transistor,
wherein the one electrode of the first capacitor is electrically connected to a gate of the third transistor,
wherein one of a source and a drain of the third transistor is electrically connected to a first electrode of the light-emitting device and one of a source and a drain of the fourth transistor, and
wherein the light-emitting device has a tandem structure comprising two or more light-emitting units being connected in series between the first electrode and a second electrode, and
wherein the first subpixel emits only blue.

6. The display apparatus according to claim 5, wherein the first, second, and third transistors each comprise a metal oxide in a channel formation region, wherein the metal oxide comprises In, Zn, and M, and wherein M is Al, Ti, Ga, Sn, Y, Zr, La, Ce, Nd, or Hf.

7. The display apparatus according to claim 5, wherein one of the first electrode and the second electrode of the light-emitting device is a light-transmitting conductive film, and
wherein the light-transmitting conductive film is in contact with a metal wiring that does not overlap with the light-emitting device.

8. The display apparatus according to claim 5, wherein the first subpixel is configured to:
store a first data;
add a second data to the first data to generate a third data; and
emit light based on the third data.

9. A display apparatus comprising:
a pixel comprising a first subpixel, a second subpixel, and a third subpixel;
wherein the first subpixel comprises a first transistor, a second transistor, a third transistor, a first capacitor, a second capacitor, and a first light-emitting device,
wherein the second subpixel comprises a second light-emitting device,
wherein one of a source and a drain of the first transistor is electrically connected to one electrode of the first capacitor,
wherein the one electrode of the first capacitor is electrically connected to one electrode of the second capacitor,
wherein the other electrode of the second capacitor is electrically connected to one of a source and a drain of the second transistor,
wherein the one electrode of the first capacitor is electrically connected to a gate of the third transistor,
wherein one of a source and a drain of the third transistor is electrically connected to a first electrode of the first light-emitting device,
wherein the first light-emitting device has a tandem structure comprising two or more light-emitting units being connected in series between the first electrode and a second electrode,
wherein the first subpixel emits only blue light, and
wherein the second light-emitting device has a single structure comprising a light-emitting unit between a pair of electrodes.

10. The display apparatus according to claim 9, wherein the first, second, and third transistors each comprise a metal oxide in a channel formation region, wherein the metal oxide comprises In, Zn, and M, and wherein M is Al, Ti, Ga, Sn, Y, Zr, La, Ce, Nd, or Hf.

11. The display apparatus according to claim 9, wherein one of the first electrode and the second electrode of the first light-emitting device is a light-transmitting conductive film, and
wherein the light-transmitting conductive film is in contact with a metal wiring that does not overlap with the first light-emitting device.

12. The display apparatus according to claim 9, wherein the first subpixel is configured to:
store a first data;
add a second data to the first data to generate a third data; and
emit light based on the third data.

* * * * *